US011965731B2

(12) United States Patent
Chang

(10) Patent No.: US 11,965,731 B2
(45) Date of Patent: Apr. 23, 2024

(54) PACKAGE STRUCTURE AND MEASUREMENT METHOD FOR THE PACKAGE STRUCTURE

(71) Applicant: TAIWAN SEMICONDUCTOR MANUFACTURING COMPANY LTD., Hsinchu (TW)

(72) Inventor: Kuei-Sung Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 507 days.

(21) Appl. No.: 17/200,868

(22) Filed: Mar. 14, 2021

(65) Prior Publication Data
US 2022/0139789 A1    May 5, 2022

Related U.S. Application Data

(60) Provisional application No. 63/109,165, filed on Nov. 3, 2020.

(51) Int. Cl.
*G01B 11/14* (2006.01)
*G01B 21/16* (2006.01)
(Continued)

(52) U.S. Cl.
CPC .............. *G01B 11/14* (2013.01); *G01B 21/16* (2013.01); *H01L 21/4817* (2013.01);
(Continued)

(58) Field of Classification Search
CPC ......... H01L 22/10; H01L 22/12; H01L 22/20; H01L 22/30; H01L 21/48; H01L 21/4817;
(Continued)

(56) References Cited

U.S. PATENT DOCUMENTS 4,070,116 A * 1/1978 Frosch .................. G01B 11/14
250/559.38
4,165,178 A * 8/1979 Coumo, Jr. ............ G01B 11/14
356/3

(Continued)

FOREIGN PATENT DOCUMENTS

CN            1565078 A      1/2005
CN         102844858 A     12/2012
(Continued)

OTHER PUBLICATIONS

English abstract of CN1565078A, 2005.
English abstract of CN102844858A, 2012.
English abstract of CN111430334A, 2020.

*Primary Examiner* — Gordon J Stock, Jr.
(74) *Attorney, Agent, or Firm* — WPAT LAW; Anthony King

(57) ABSTRACT

The present disclosure provides a measurement method including providing a base, a device disposed on the base, and a lid disposed over the base and the device; irradiating a top surface of the device through an opening of the lid to obtain a first focal plane associated with a top surface of the device; irradiating the lid at the lower end of the opening to obtain a second focal plane associated with the lid at the lower end of the opening; and deriving a distance between the top surface of the device and an interior surface of the lid facing the top surface of the device based on a difference between a level of the first focal plane and a level of the second focal plane. The present disclosure also provides a package structure for the measurement.

20 Claims, 25 Drawing Sheets

(51) Int. Cl.
*H01L 21/48* (2006.01)
*H01L 21/50* (2006.01)
*H01L 21/56* (2006.01)
*H01L 21/66* (2006.01)
*H01L 23/04* (2006.01)
*H01L 23/043* (2006.01)
*H01L 23/28* (2006.01)
*G01B 7/31* (2006.01)

(52) U.S. Cl.
CPC .............. *H01L 21/50* (2013.01); *H01L 21/56* (2013.01); *H01L 22/12* (2013.01); *H01L 23/04* (2013.01); *H01L 23/043* (2013.01); *H01L 23/28* (2013.01); *G01B 7/31* (2013.01)

(58) Field of Classification Search
CPC ......... H01L 21/50; H01L 21/52; H01L 21/54; H01L 21/56; H01L 21/561; H01L 21/563; H01L 21/565; H01L 21/67121; H01L 21/67126; H01L 23/02; H01L 23/04; H01L 23/041; H01L 23/043; H01L 23/053; H01L 23/28; H01L 23/31; H01L 23/3107; H01L 23/3114; G01B 21/02; G01B 21/16; G01B 21/18; G01B 21/28; G01B 11/02; G01B 11/14; G01B 11/16; G01B 11/18; G01B 11/22; G01B 11/28; G01B 11/285

See application file for complete search history.

(56) References Cited

U.S. PATENT DOCUMENTS

| | | | | |
|---|---|---|---|---|
| 6,500,683 | B1* | 12/2002 | Nakabayashi | G01B 11/22 438/243 |
| 7,115,981 | B2* | 10/2006 | Grigg | H01L 23/49816 257/667 |
| 8,830,458 | B2* | 9/2014 | Shyu | G01B 11/24 356/241.1 |
| 8,873,067 | B2* | 10/2014 | Lee | G01B 11/24 356/504 |
| 9,752,866 | B2* | 9/2017 | Wei | G01B 11/22 |
| 10,157,457 | B2* | 12/2018 | Xu | G01N 21/8851 |
| 10,498,948 | B1* | 12/2019 | Celik | H04N 23/673 |
| 10,685,852 | B2* | 6/2020 | Hsieh | H01L 21/67126 |
| 10,727,141 | B2* | 7/2020 | Juan | H01L 22/12 |
| 2022/0148992 | A1* | 5/2022 | Chang | H01L 23/10 |

FOREIGN PATENT DOCUMENTS

CN 111430334 A 7/2020
KR 20090116116 A * 11/2009

* cited by examiner

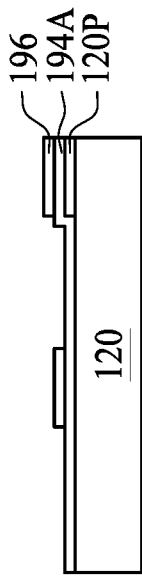
FIG. 16A
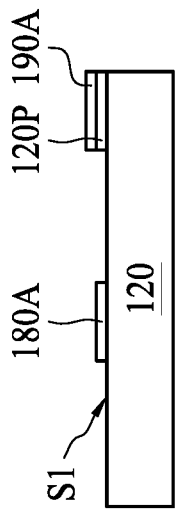
FIG. 16D
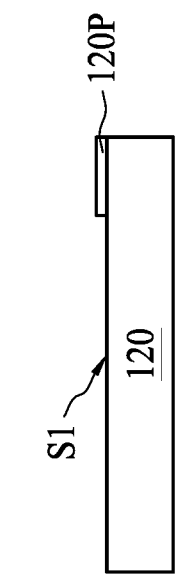
FIG. 16B
FIG. 16E
FIG. 16C

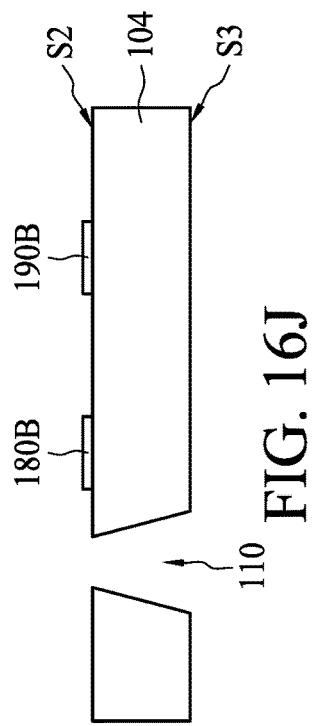
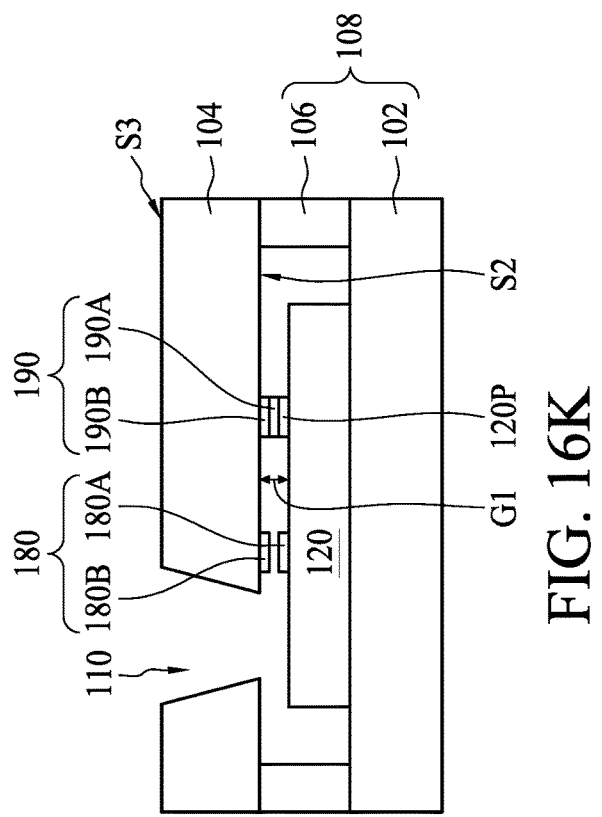
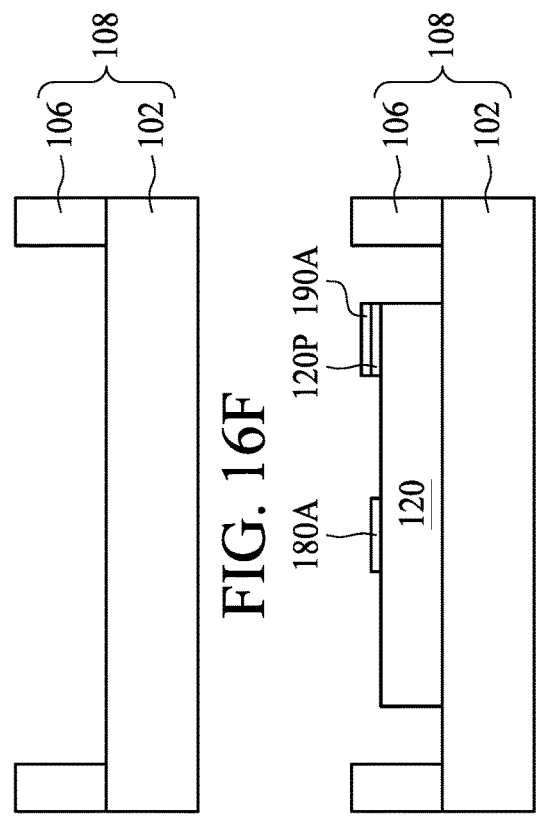
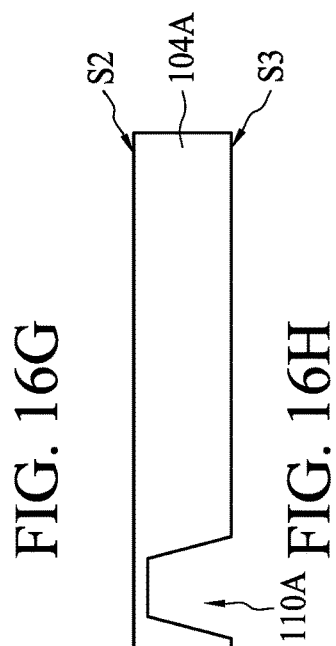
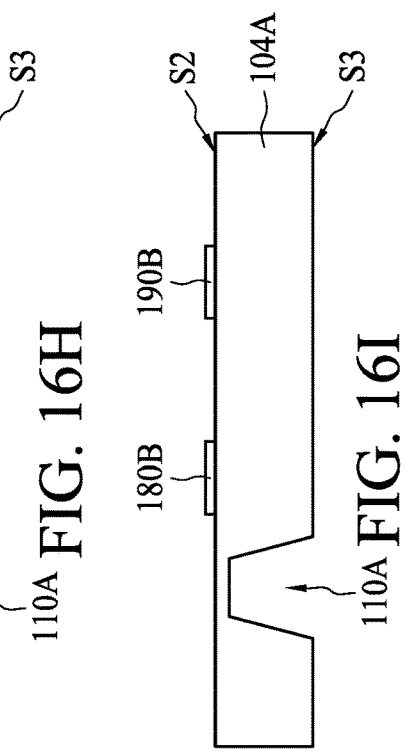
FIG. 16F  FIG. 16G  FIG. 16H  FIG. 16I  FIG. 16J  FIG. 16K

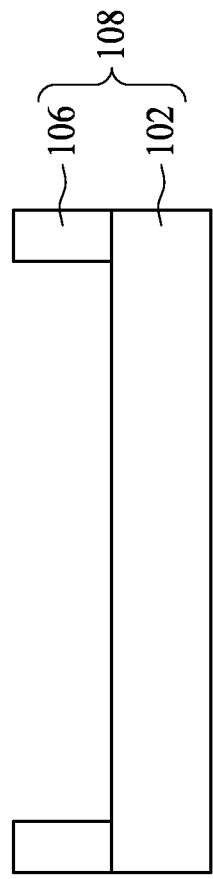
FIG. 18A
FIG. 18B
FIG. 18C
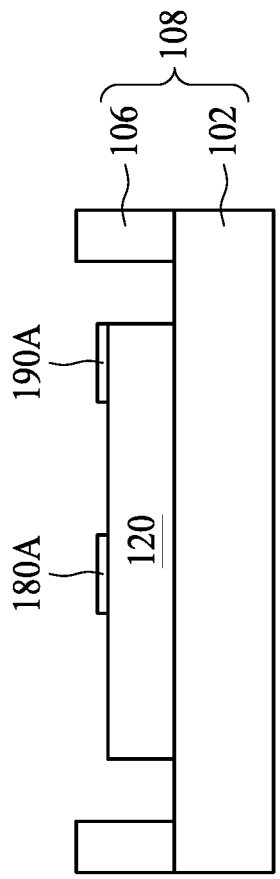
FIG. 18D
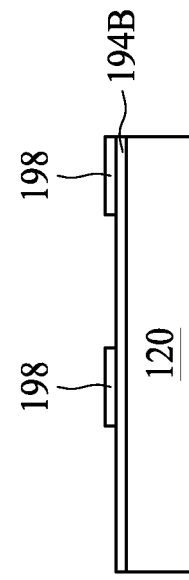
FIG. 18E
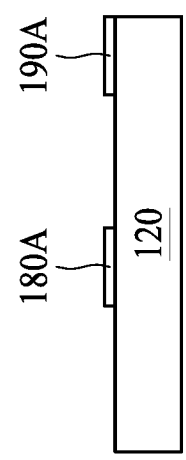

11,965,731 B2

PACKAGE STRUCTURE AND MEASUREMENT METHOD FOR THE PACKAGE STRUCTURE

CROSS REFERENCE TO RELATED APPLICATIONS

This application is related to Applicant's previously filed U.S. Application Ser. No. 63/109,165, filed Nov. 3, 2020, which is herein incorporated by reference.

BACKGROUND

Semiconductor devices are typically packaged using a molding material, and then may be installed on a base that includes electrical circuitry, such as a printed circuit board (PCB). After the semiconductor device is packaged, some parameters related to the semiconductor device inside the molding material are difficult to determine. Conventional measuring methods fail to precisely obtain the parameters because these methods inevitably accumulate deviations or tolerances of the components in the package structure. The derived parameters are usually incorrect or insufficiently precise.

Therefore, there is a continuous need to modify the package structure and the measurement method for determining parameters inside the package structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 16A to 16K are schematic cross-sectional views illustrating sequential fabrication stages of the package structure in FIG. 11, in accordance with some embodiments of the present disclosure.

FIGS. 18A to 18I are schematic cross-sectional views illustrating sequential fabrication stages of the package structure in FIG. 12, in accordance with some embodiments of the present disclosure.

DETAILED DESCRIPTION OF THE DISCLOSURE

Figure 1:
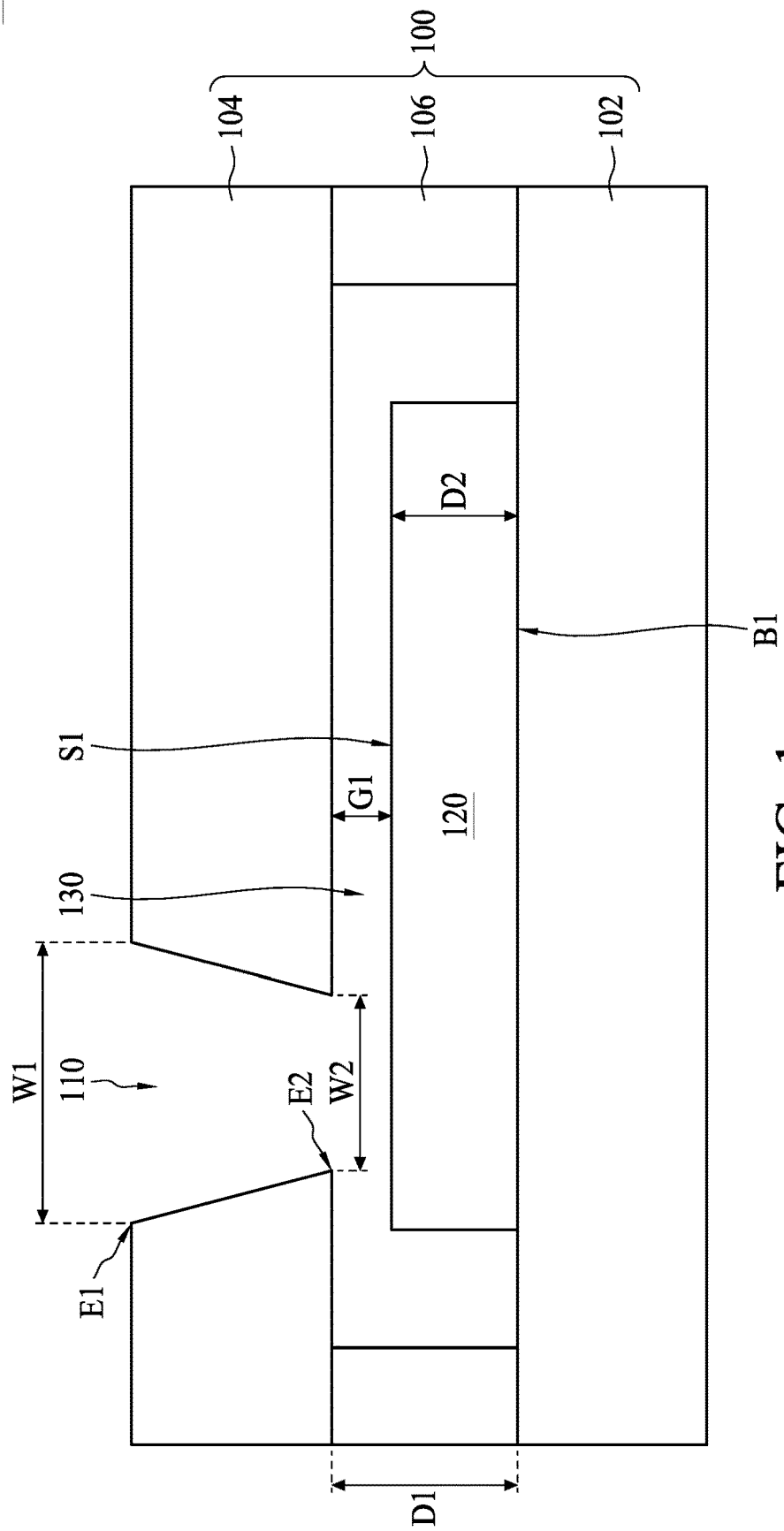
FIG. 1 is a schematic cross-sectional view showing a package structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in some embodiments to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

For some devices that are encased by a molding material to form a package structure, there is a need to leave a space between the device and the molding material. For example, optical devices that include lens modules need a gap in order to accommodate a proper focal length from a lens to an image sensor such as a CMOS image sensor (CIS) or a charge-coupled device (CCD).

Controlling the gap size (e.g., gap width or gap volume) inside the package structure is important. For instance, in some applications, the gap size needs to be precisely controlled for considerations such as air flow resistance or heat dissipation of the device inside the package structure. In some embodiments, the gap size influences flexibility of the device when the device is subjected to an external impact or mechanical force. Therefore, the gap size is generally related to the durability of a device within a package structure, especially for an optical device. In particular, the gap size is critical to the performance of such optical devices.

However, it is difficult to measure the gap size once the device is packaged. Besides, it is not easy to precisely control the gap size. For package structures using epoxy resin or ceramics as the molding material, the gap size is controlled by dimensions (e.g., thickness or height) of the device and the molding material. Although the gap size can be directly determined by observing a difference between dimensions of the device and dimensions of a portion of the molding material, precision of the gap size is difficult to obtain.

FIG. 1 is a schematic cross-sectional view showing a package structure P10, in accordance with some embodiments of the present disclosure. The package structure P10 includes a molding member 100 and a device 120 inside the molding member 100. In some embodiments, the molding member 100 includes a base 102, a lid 104 covering the base 102 and a sidewall 106 connecting the base 102 and the lid 104. In some embodiments, the device 120 is disposed on the base 102, surrounded by the sidewall 106 and covered by the lid 104. In some embodiments, the device 120 has a top surface S1 facing the lid 104 and a bottom surface BI facing the base 102. In some embodiments, the bottom surface BI contacts the base 102. In some embodiments, the base 102, the lid 104 and the sidewall 106 are separable. In other embodiments, the base 102, the lid 104 and the sidewall 106 can be integral such that the molding member 100 is a single structure that encases the device 120. In some embodiments, the molding member 100 is made of, for example but not limited to, epoxy resin or ceramics such as low-temperature co-fired (LTCC) ceramics or high-temperature co-fired (HTCC) ceramics. In some embodiments, the device 120 includes active components or passive components, for example but not limited to, complementary metal-oxide semiconductors (CMOS), micro-electromechanical systems (MEMS), stacks of CMOS and MEMS, resistors, capacitors, inductors, image sensors, motion sensors, microphones, speakers or motion stabilizers.

Still referring to FIG. 1, in some embodiments, the lid 104 includes an opening 110 penetrating the lid 104. In some embodiments, the opening 110 is positioned above the device 120 such that the device 120 in the molding member 100 is at least partially exposed by the opening 110. In some embodiments, the opening 110 has a frustoconical shape. In some embodiments, the opening 110 is tapered toward the device 120. In some embodiments, the opening 110 has a first width W1 at an upper end E1 of the opening 110 distal from the device 120 and a second width W2 at a lower end E2 of the opening 110 proximal to the device 120. In some embodiments, the first width W1 is between 50 um and 1000 um and is greater than the second width W2. In some embodiments, a difference between the first width and the second width is between about 5 micrometer (um) and about 100 um.

Still referring to FIG. 1, in some embodiments, a gap 130 is between the lid 104 and the device 20 inside the molding member 100. In some embodiments, the sidewall 106 has a height D1, the device 120 has a thickness D2 and the gap 130 has a gap width G1, wherein the gap width G1 is defined as a distance between the top surface S1 of the device 120 and an interior surface of the lid 104 facing the device 120. In some embodiments, the gap width G1 is between about 5 um and about 500 um.

Figure 2:
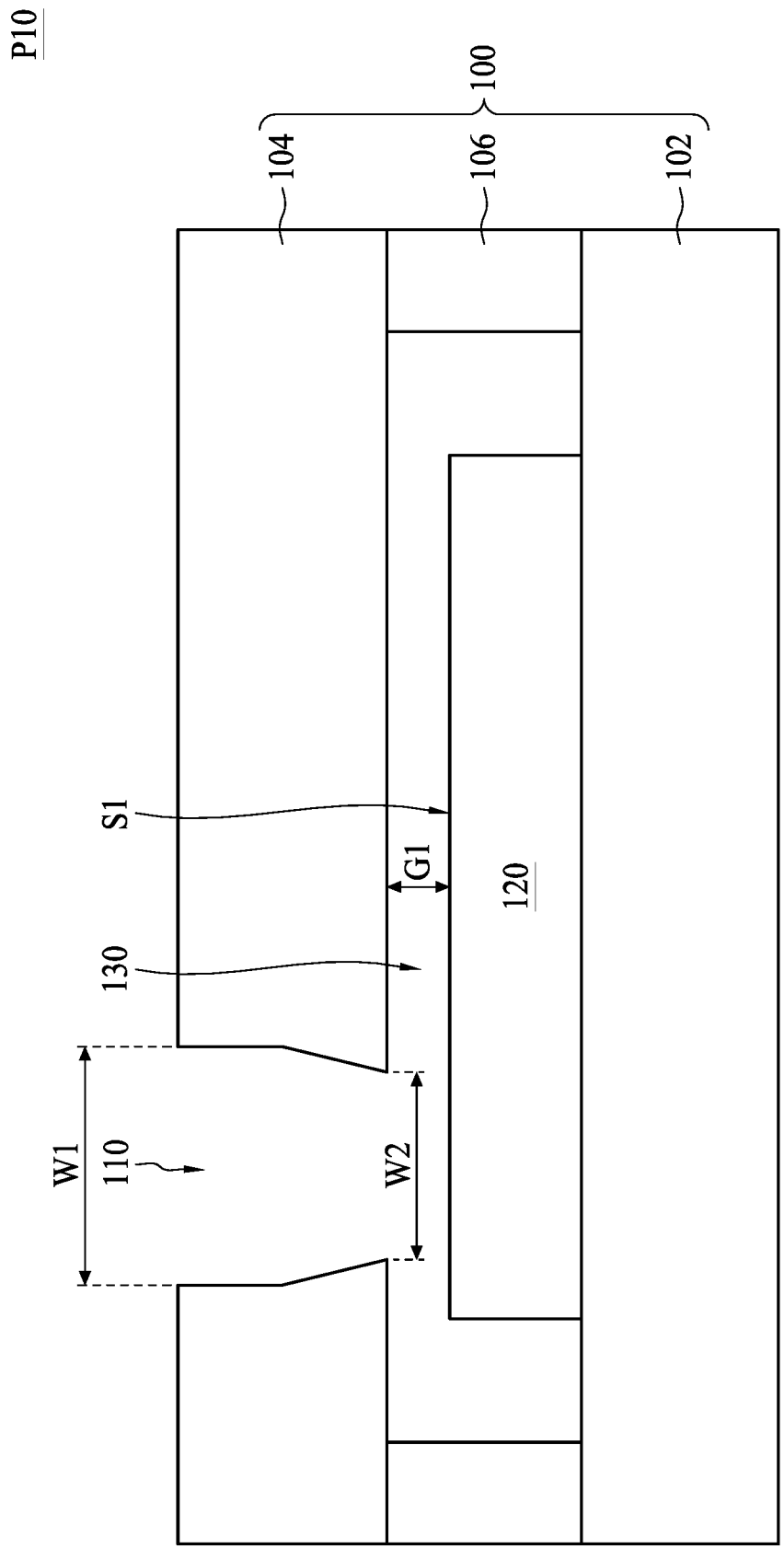
FIGS. 2 and 3 are schematic cross-sectional views showing the package structure in FIG. 1 having differently-shaped openings, in accordance with other embodiments of the present disclosure.
Figure 3:
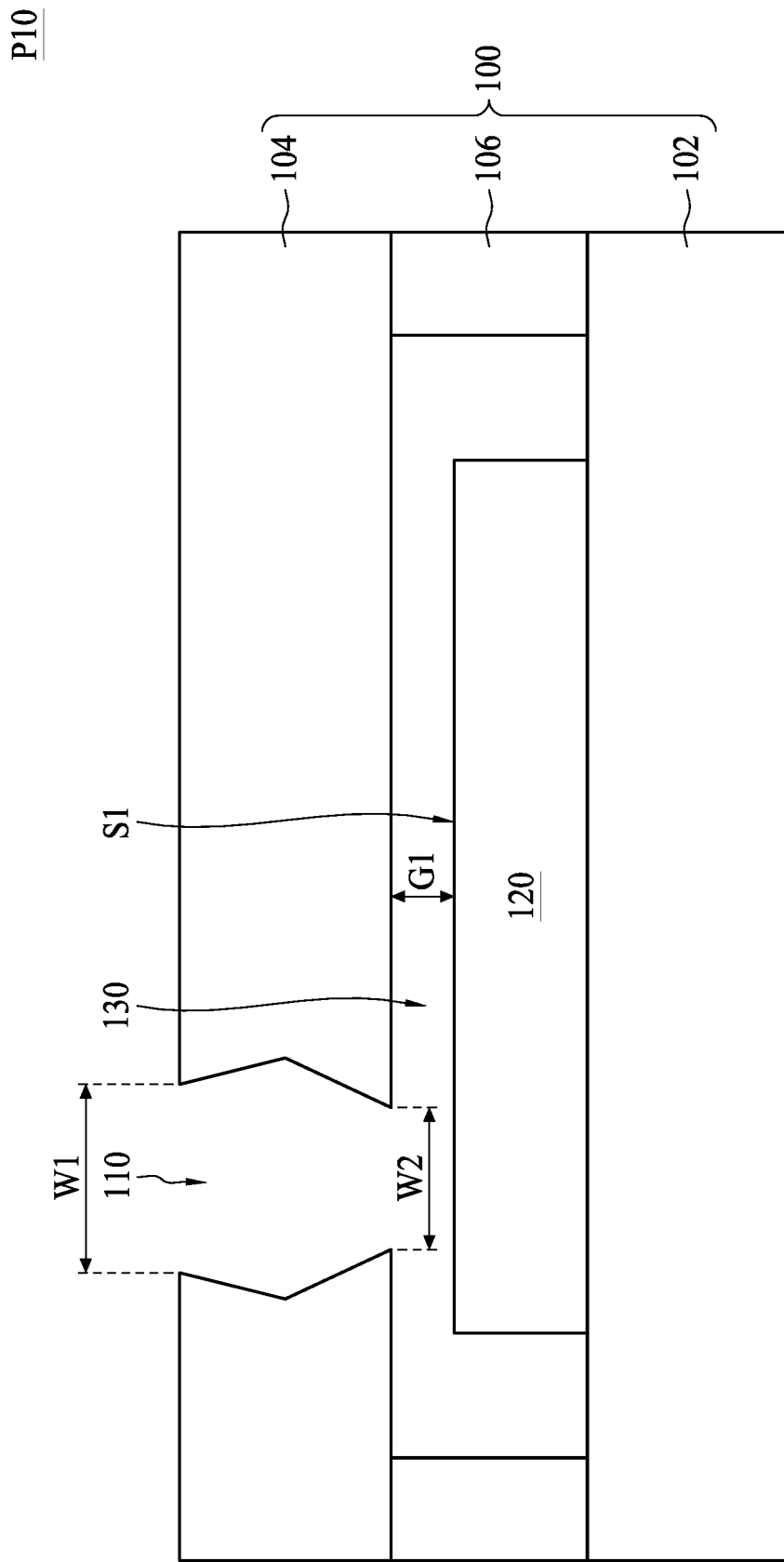

In other embodiments, the opening 110 may have different shapes. FIGS. 2 and 3 are schematic cross-sectional views showing the package structure P10 in FIG. 1 has differently-shaped openings 110, in accordance with other embodiments of the present disclosure. Referring to FIG. 2, in one embodiment, the opening 110 has a width starting from the first width W1, remaining constant to a central portion of the opening 110, and then tapering toward the base 102 to the second width W2. Referring to FIG. 3, in another embodiment, the opening 110 has a width starting from the first width W1, increasing toward a central portion of the opening 110, and then tapering toward the base 102 to the second width W2. In some embodiments, the first width W1 is greater than the second width W2.

Figure 4:
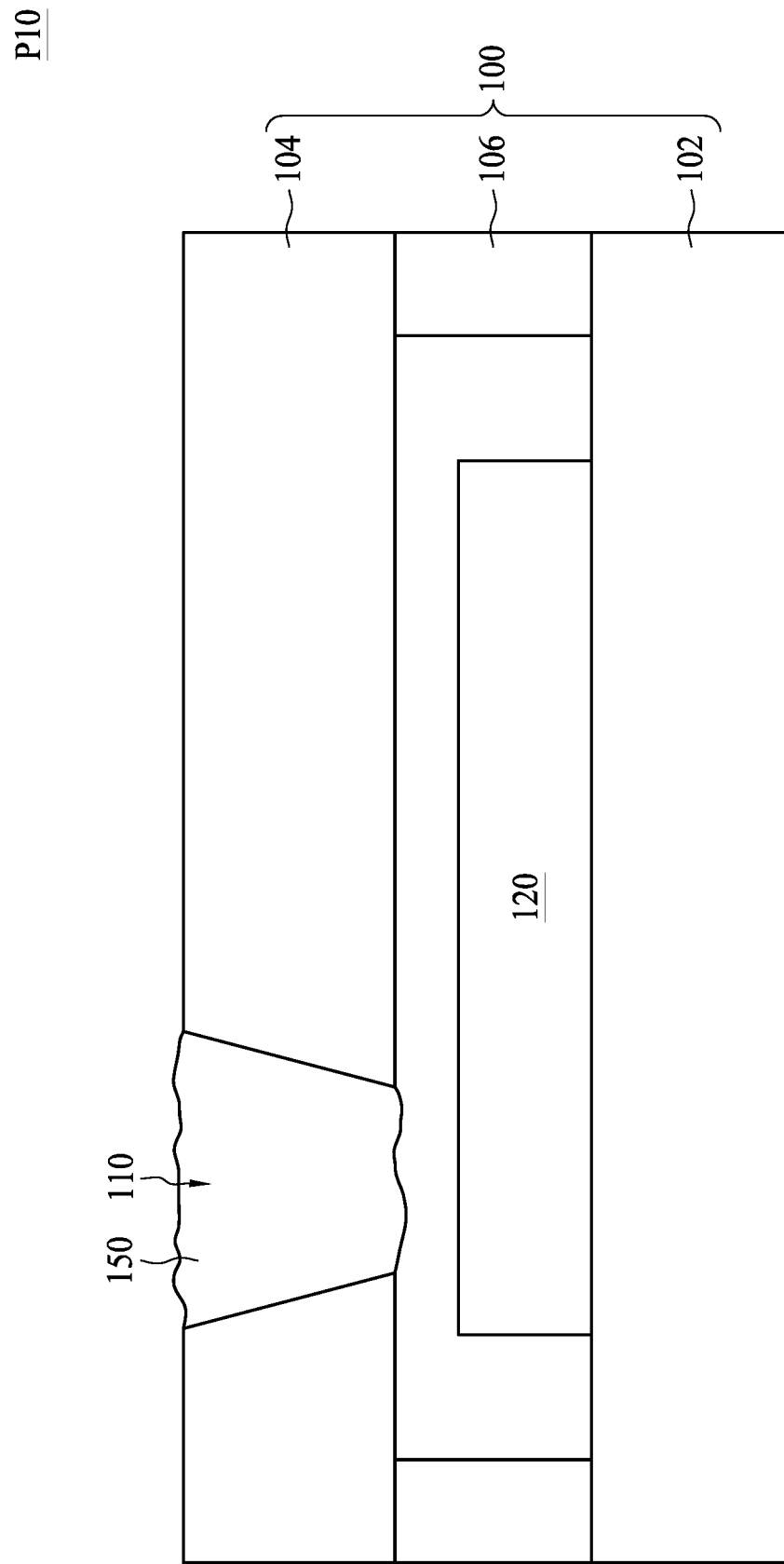
FIGS. 4 to 8 are schematic cross-sectional views showing the package structure in any one of FIGS. 1 to 3 with various additional components, in accordance with some embodiments of the present disclosure.

FIGS. 4 to 8 are schematic cross-sectional views showing the package structure P10 in any one of FIGS. 1 to 3 with various additional components, in accordance with some embodiments of the present disclosure. Referring to FIG. 4, in some embodiments, the opening 110 of the lid 104 can be filled with a sealing member 150. The sealing member 150 can protect the device 120 in the package structure P10 from being contaminated by particles or moisture. In some embodiments, the sealing member 150 is made of, for example but not limited to, epoxy resin, silicone, glass frit, plastic, glass, metal or ceramics. In some embodiments, the sealing member 150 can be opaque or transparent. In some embodiments, the sealing member 150 can be easily removed from the package structure P10, and thus the opening 110 can be formed by removing the sealing member 150.

Figure 5:
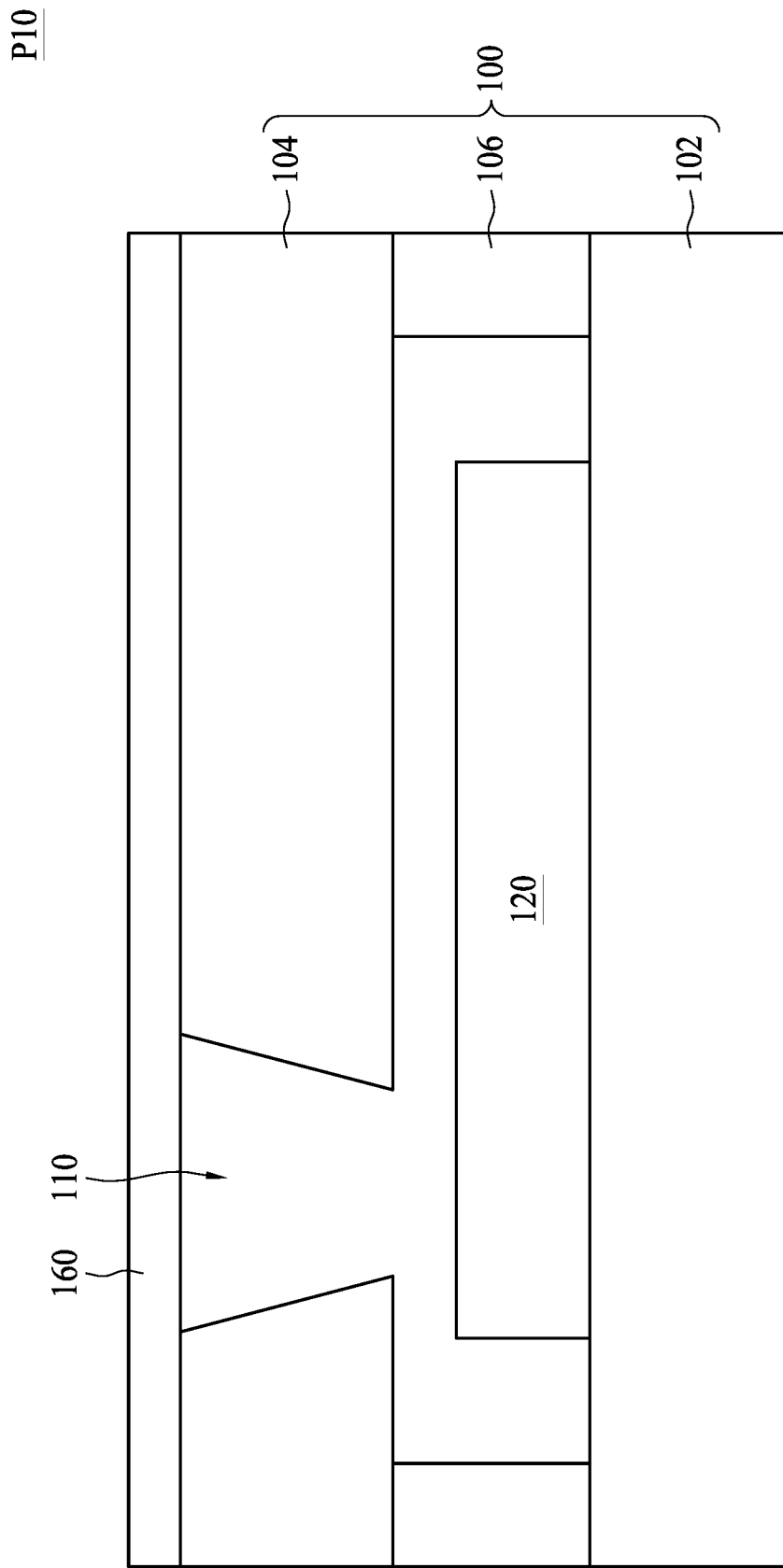

Referring to FIG. 5, in some embodiments, the opening 110 of the lid 104 can be covered by a capping member 160. The capping member 160 can protect the device 120 in the package structure P10 from being contaminated by particles or moisture. In some embodiments, the capping member 160 is made of, for example but not limited to, plastic, glass, metal or ceramics. In some embodiments, an area of the capping member 160 is greater or less than an area of the lid 104. In other embodiments, the area of the capping member 160 is substantially equals to the area of the lid 104.

Figure 6:
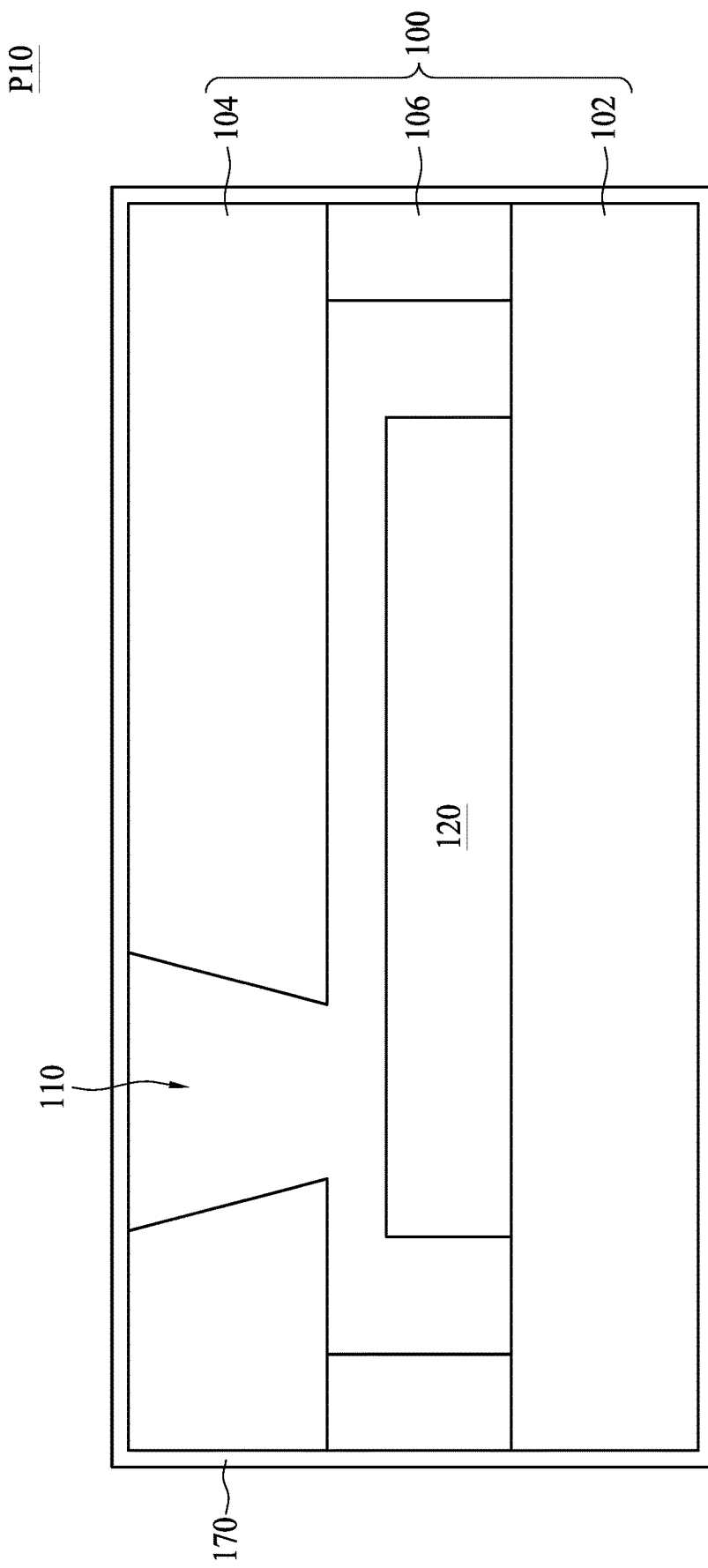

Referring to FIG. 6, in some embodiments, the package structure P10 can be sealed in a casing member 170. The casing member 170 can protect the device 120 in the package structure P10 from being contaminated by particles or moisture. In some embodiments, the casing member 170 is made of, for example but not limited to, epoxy resin, silicone, glass frit, plastic, glass, metal or ceramics. In some embodiments, the casing member 170 can be opaque or transparent.

In some embodiments, either one of the sealing member 150, the capping member 160 and the casing member 170 or their combinations can be disposed on the package structure P10, depending on practical requirement.

Figure 7:
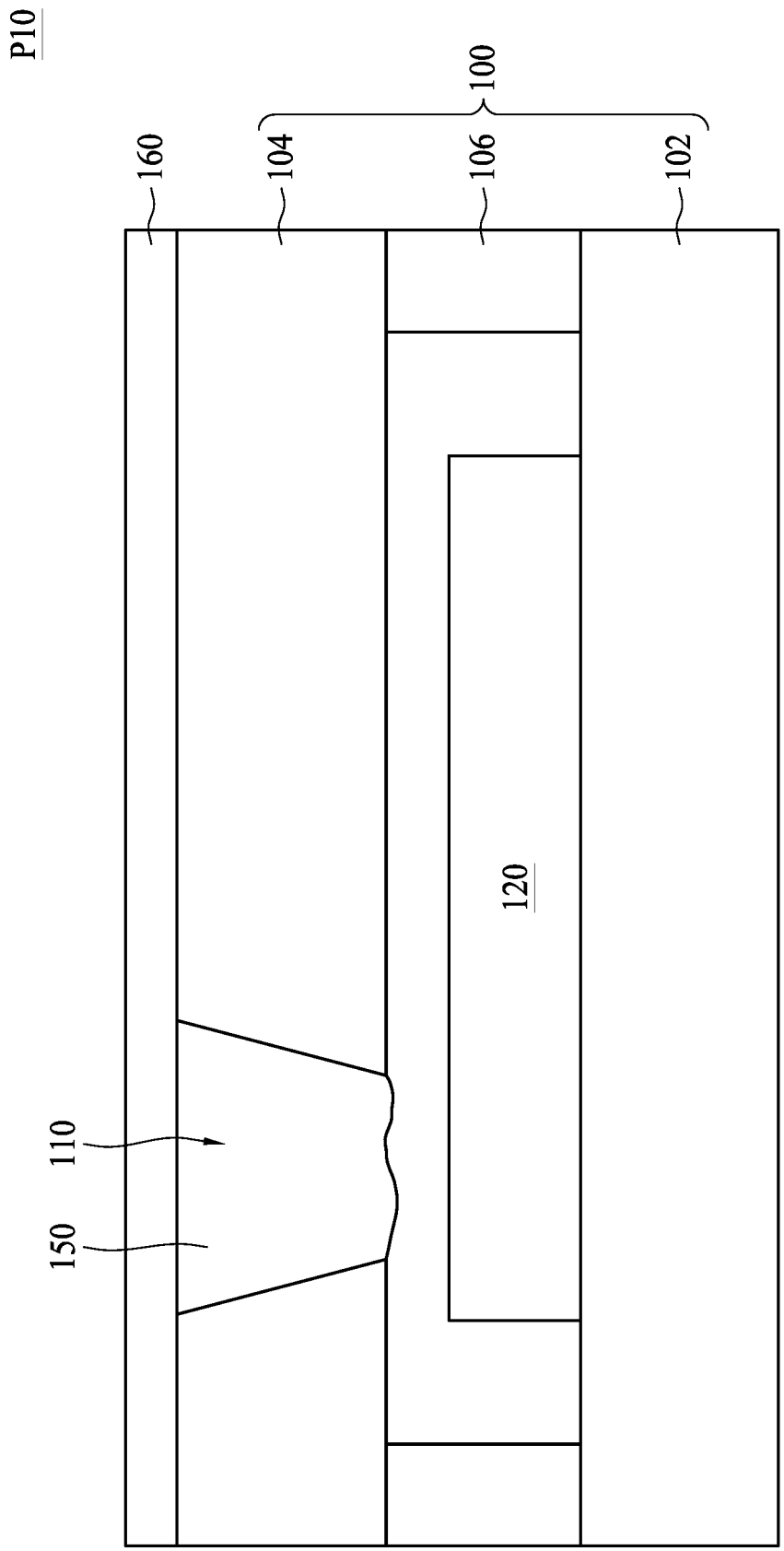

For example, referring to FIG. 7, in some embodiments, the opening 110 of the lid 104 is filled with the sealing member 150 and covered by the capping member 160. In such embodiments, the sealing member 150 can provide adhesion of the capping member 160 to the lid 104.

Figure 8:
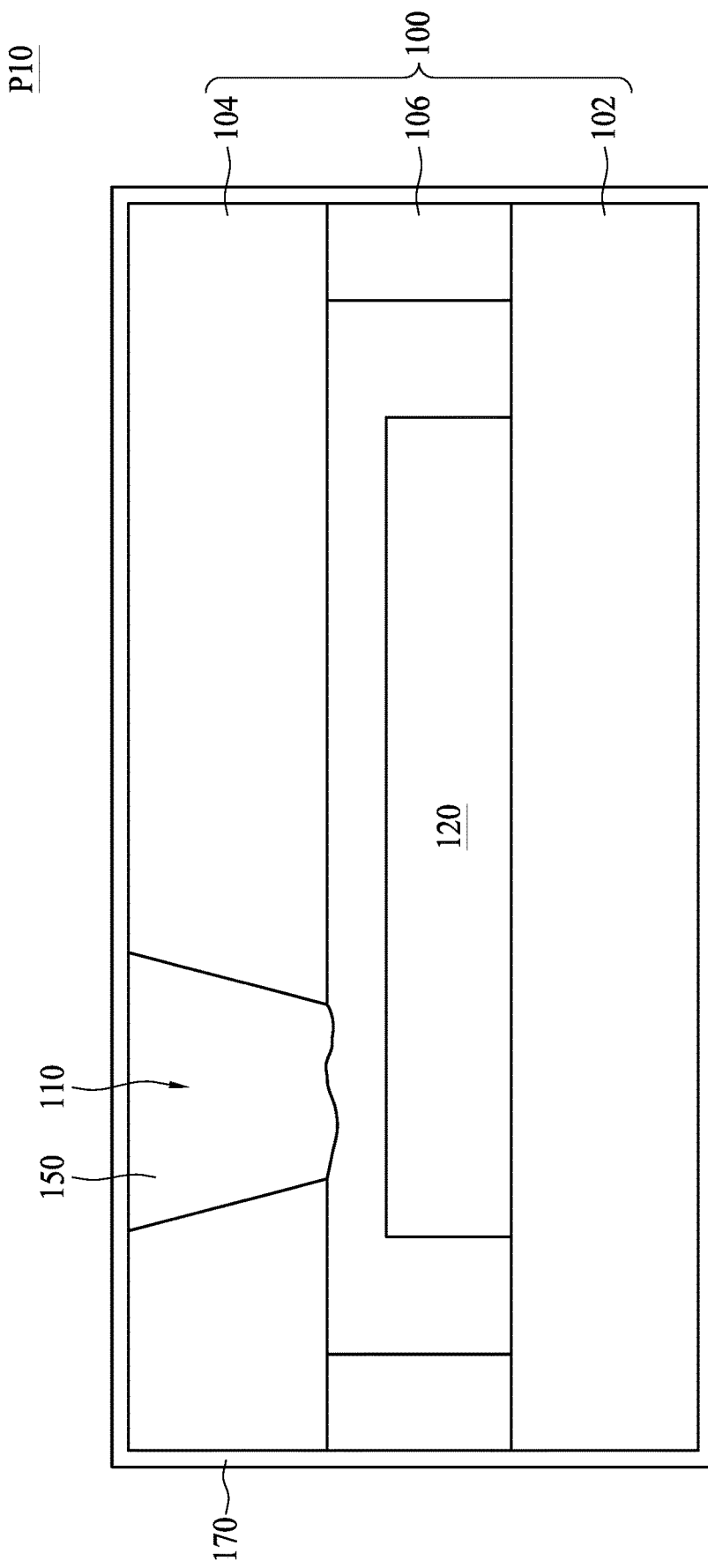

Referring to FIG. 8, in some embodiments, the opening 110 of the lid 104 is filled with the sealing member 150 and the package structure P10 is encased in the casing member 170. The casing member 170 may be in contact with the sealing member 150. In such embodiments, the sealing member 150 can provide adhesion of the casing member 170 to the lid 104.

Figure 9:
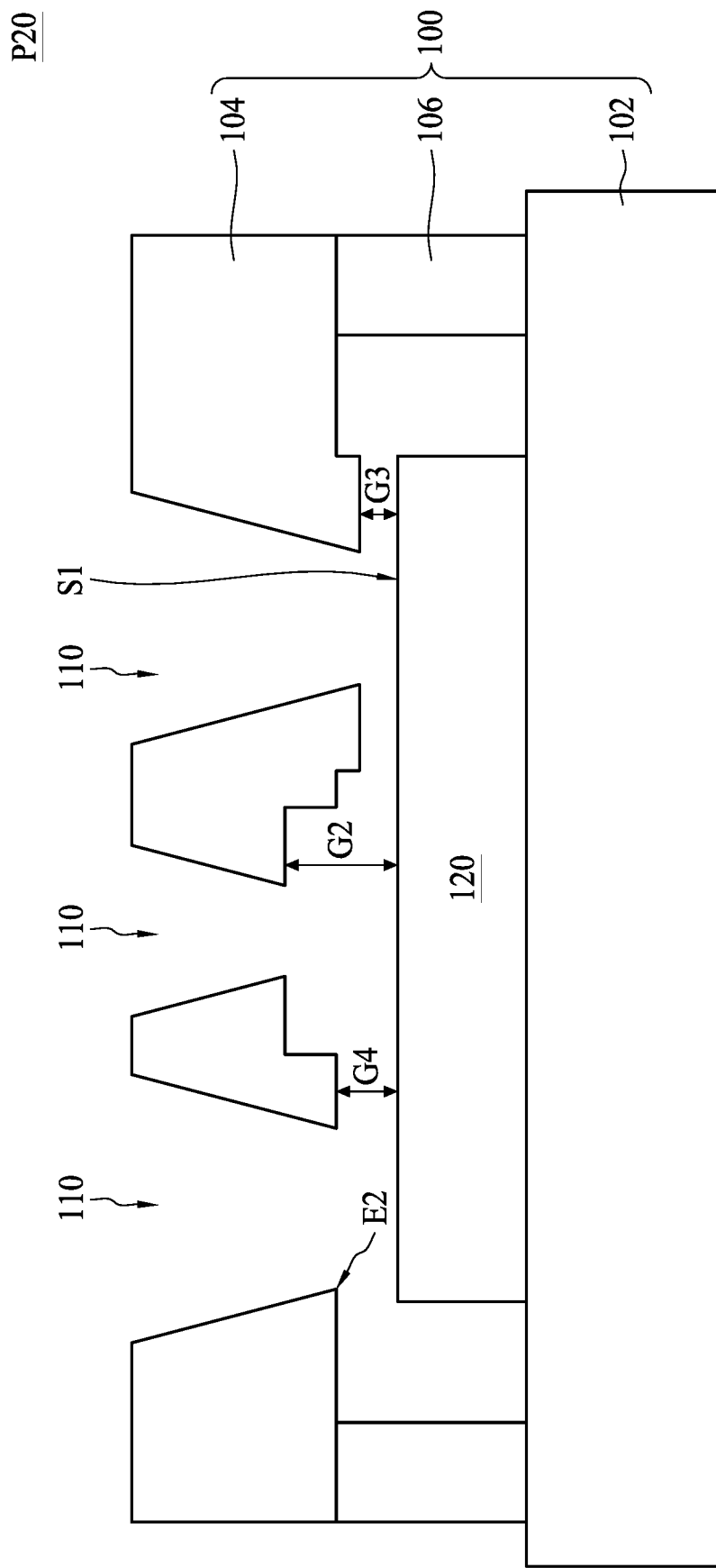
FIG. 9 is a schematic cross-sectional view showing another package structure, in accordance with some embodiments of the present disclosure.

FIG. 9 is a schematic cross-sectional view showing a package structure P20, in accordance with some embodiments of the present disclosure. The package structure P20 is similar to the package structure P10, except the lid 104 of the package structure P20 includes multiple portions with different thicknesses. Therefore, multiple gap widths G2, G3 and G4 and the like can be present between the top surface S1 of the device 120 and interior surfaces of the lid 104 facing the device 120. In some embodiments, an opening 110 can be disposed in each position of the lid 104 having a different thickness. Therefore, multiple openings 110 can be separately disposed in the lid 104 and the openings 110 expose portions of the device 120 inside the molding member 100. In some embodiments, each of the openings 110 has a greater width at an upper end distal from the device 120 and a smaller width at a lower end proximal to the device 120.

Figure 10:
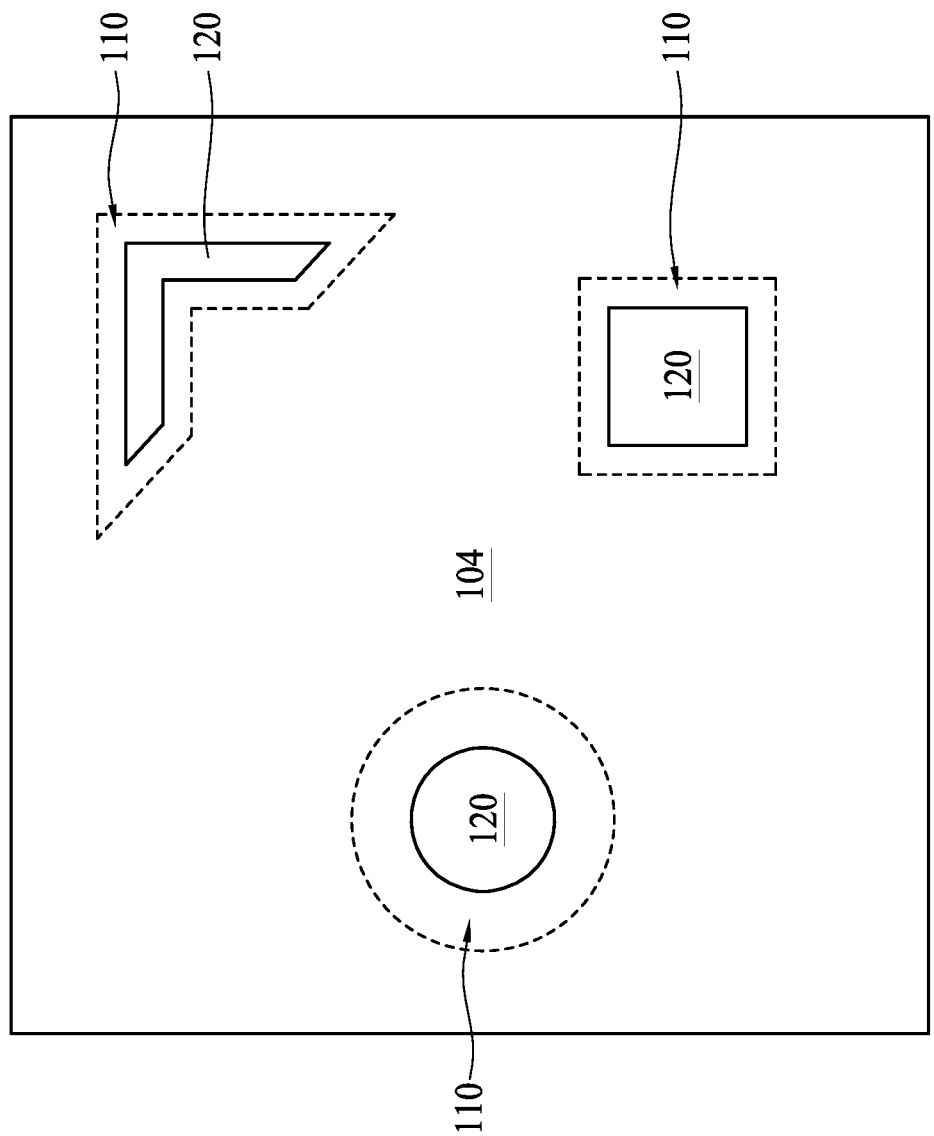
FIG. 10 shows the openings in various shapes from the top view, in accordance with some embodiments of the present disclosure.

In some embodiments, the shape of the opening 110 is not limited. FIG. 10 shows the openings 110 in various shapes from the top view, in accordance with some embodiments of the present disclosure. Portions of the device 120 are visible through the openings 110, while most of the device 120 is obscured below the lid 104. In some embodiments, the shape of the openings 110 from the top view can be various shapes such as circular, triangular, rectangular, square, L-shaped, etc., as long as the opening 110 is tapered toward the device 120.

Figure 11:
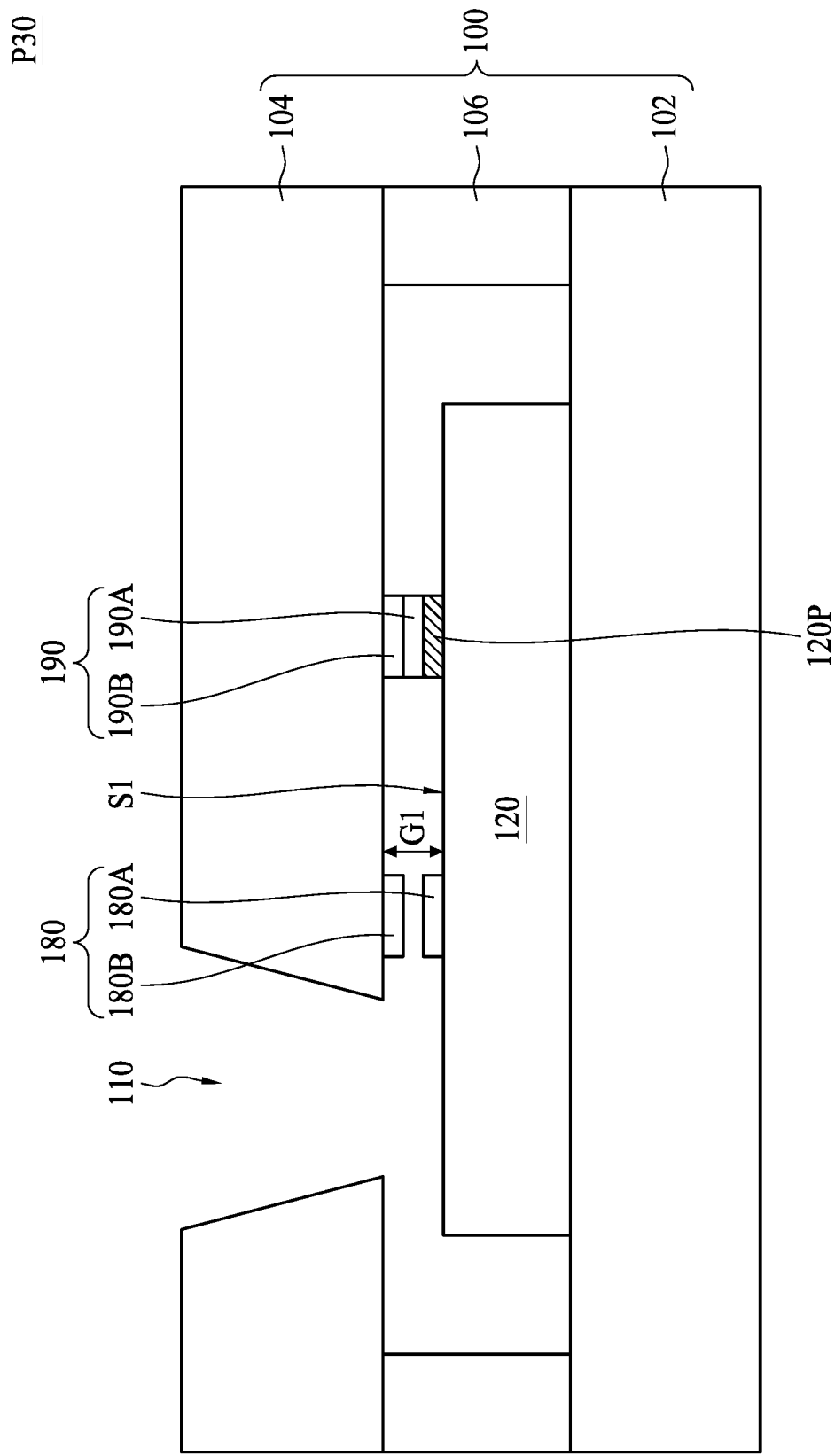
FIGS. 11 to 14 are schematic cross-sectional views showing other package structures, in accordance with some embodiments of the present disclosure.
Figure 12:
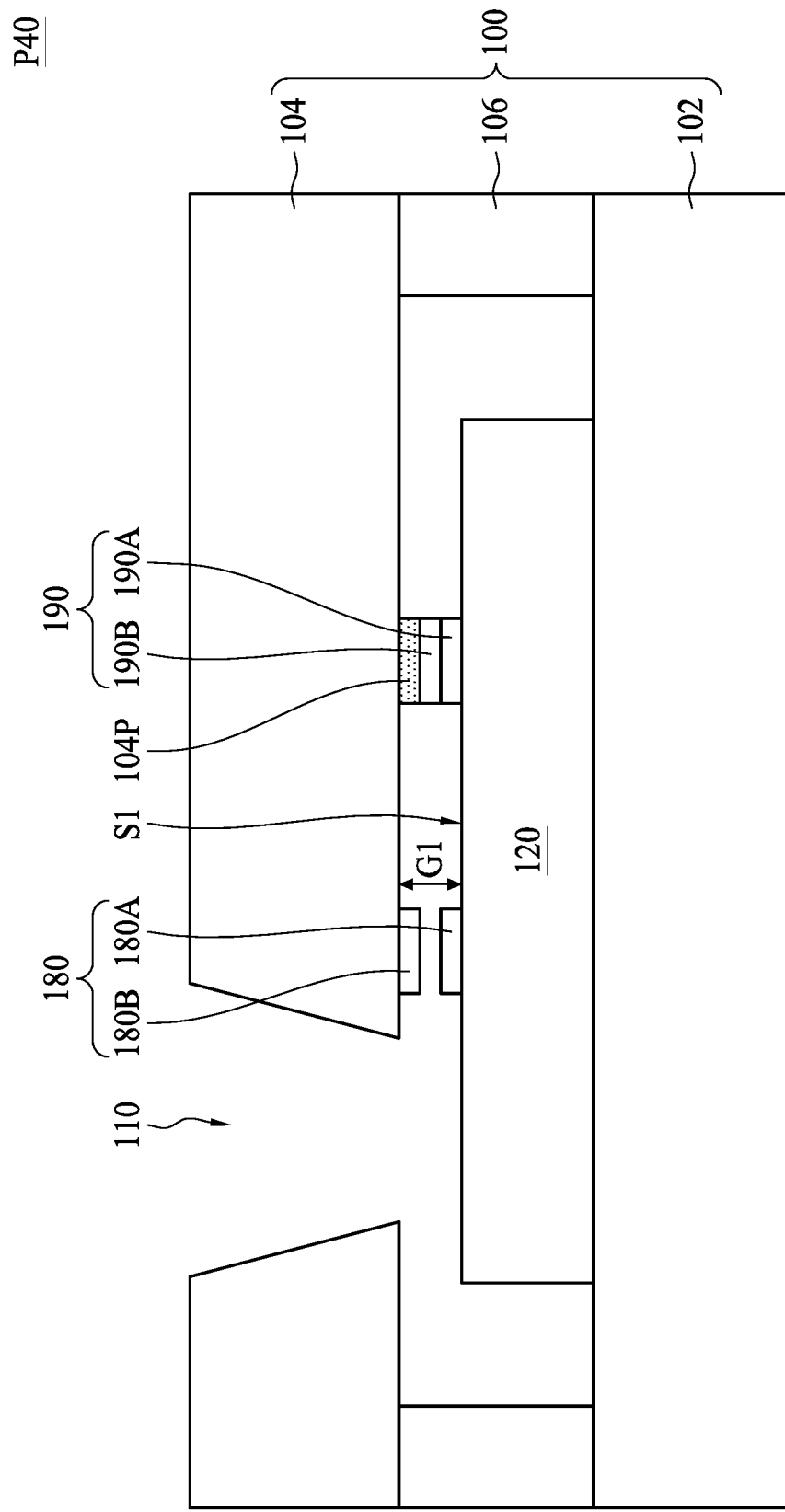

FIGS. 11 and 12 are schematic cross-sectional views showing package structures P30 and P40, in accordance with some embodiments of the present disclosure. The package structures P30 and P40 are similar to the package structure P10, except the package structures P30 and P40 further include two electrode pairs.

Referring to FIG. 11, the package structure P30 includes a first electrode pair 180 and a second electrode pair 190 disposed between the top surface S1 of the device 120 and the interior surface of the lid 104 facing the top surface S1.

In some embodiments, the first and second electrode pairs 180, 190 are made of conductive materials such as aluminum, copper, iron, silver or gold. In some embodiments, the first electrode pair 180 includes a first electrode 180A attached to the top surface S1 of the device 120 and a second electrode 180B attached to the interior surface of the lid 104, wherein the first electrode 180A is aligned with the second electrode 180B. In some embodiments, the second electrode pair 190 includes a third electrode 190A attached to the top surface S1 of the device 120 and a fourth electrode 190B attached to the interior surface of the lid 104, wherein the third electrode 190A is aligned with the fourth electrode 190B. In some embodiments, a protruding member 120P is formed on the top surface S1 of the device 120. In such embodiments, the third electrode 190A is disposed on and supported by the protruding member 120P. In some embodiments, the protruding member 120P is configured to ensure contact between the third electrode 190A and the fourth electrode 190B.

Referring to FIG. 12, the package structure P40 is similar to the package structure P30 in FIG. 11, except the position of the protruding member. In some embodiments, a protruding member 104P is formed on the interior surface of the lid 104. In such embodiments, the fourth electrode 190B is disposed on and supported by the protruding member 104P. In some embodiments, the protruding member 104P is configured to ensure contact between the third electrode 190A and the fourth electrode 190B.

Figure 13:
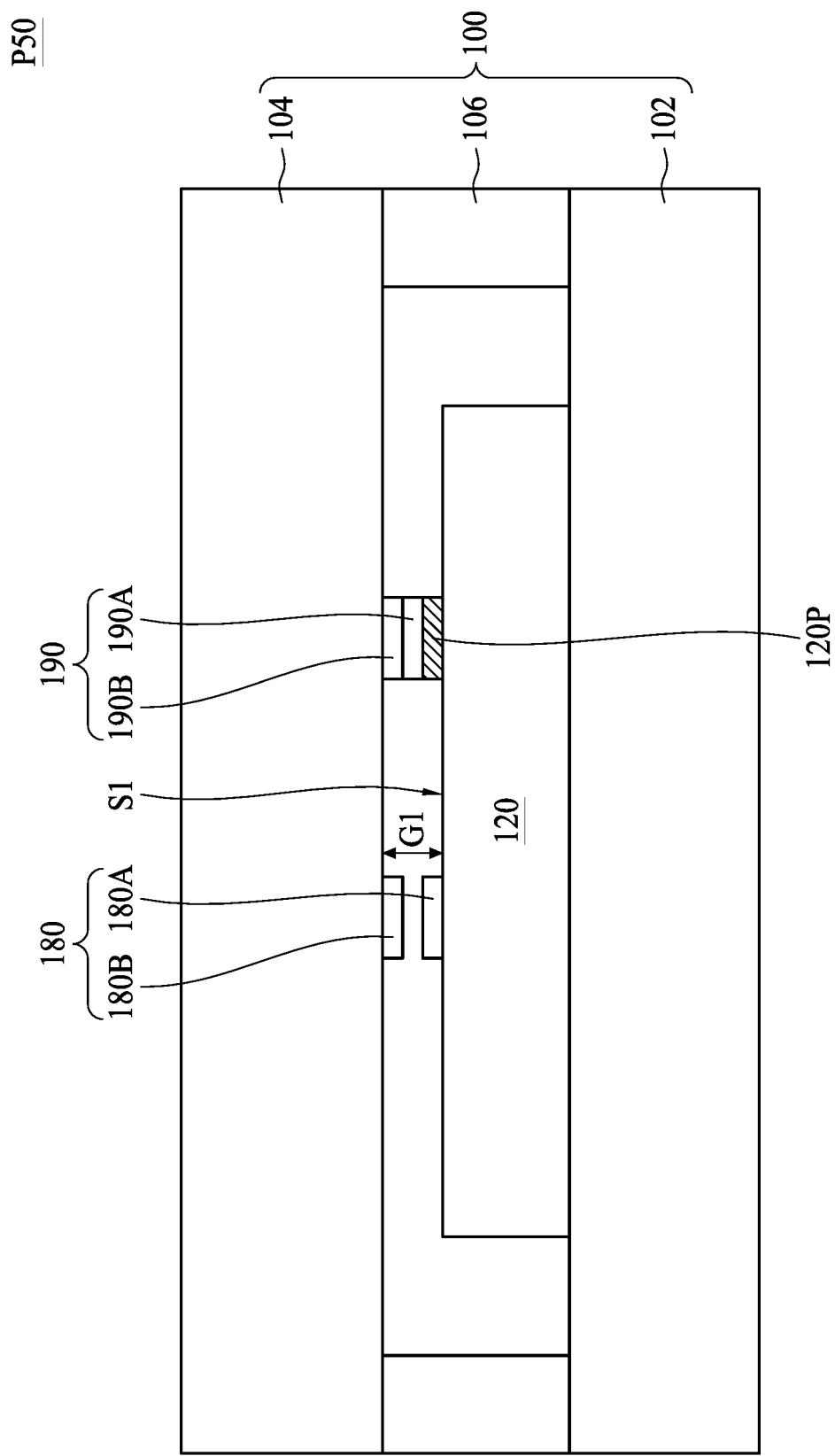
Figure 14:
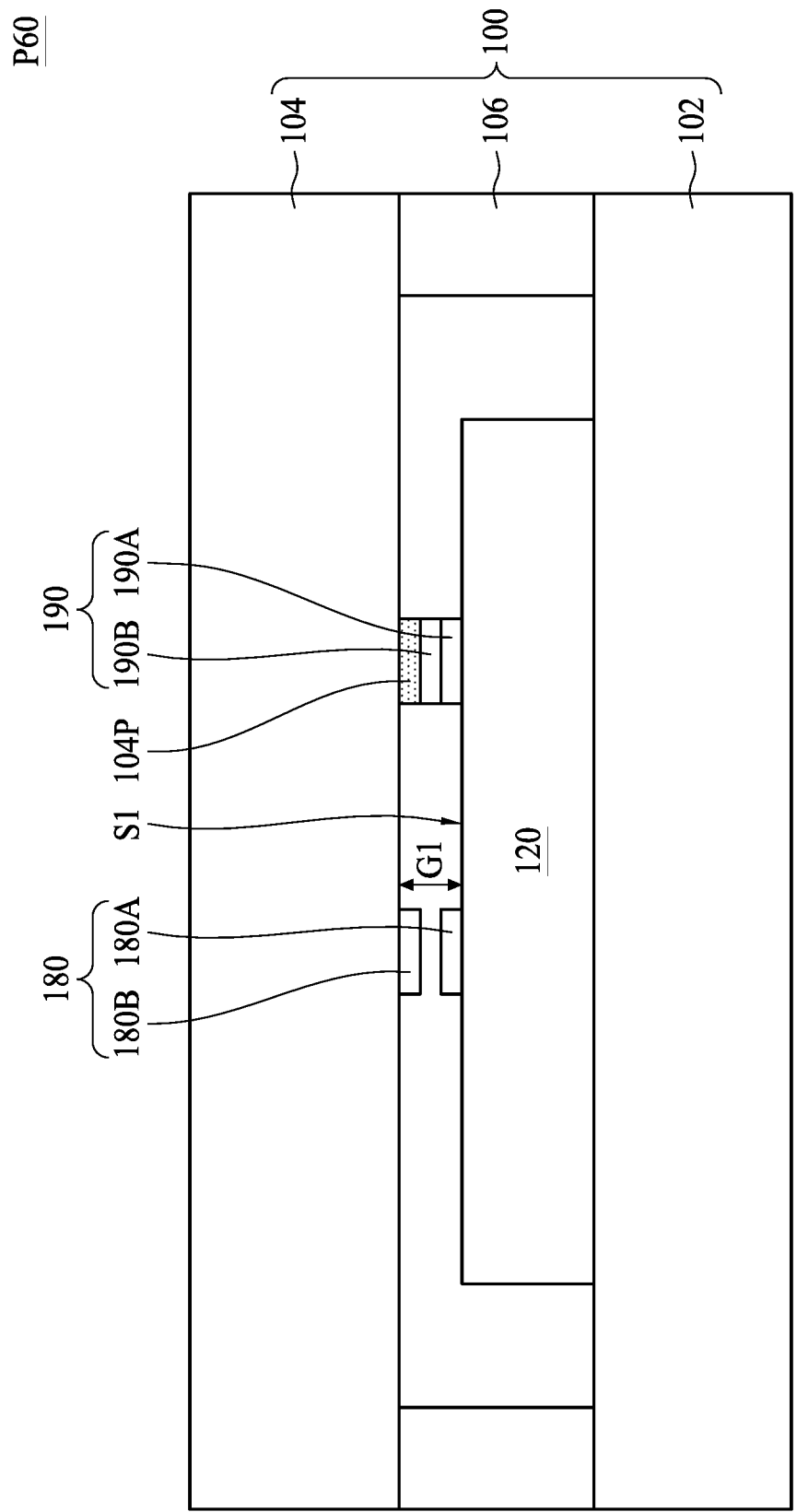

FIGS. 13 and 14 are schematic cross-sectional views showing package structures P50 and P60, in accordance with some embodiments of the present disclosure. The package structures P50 and P60 are respectively similar to the package structures P30 and P40 respectively, except the lids 104 of the package structures P50 and P60 do not have any opening. In such embodiments, the device 120 is completely encased in the molding member 100.

Figure 15:
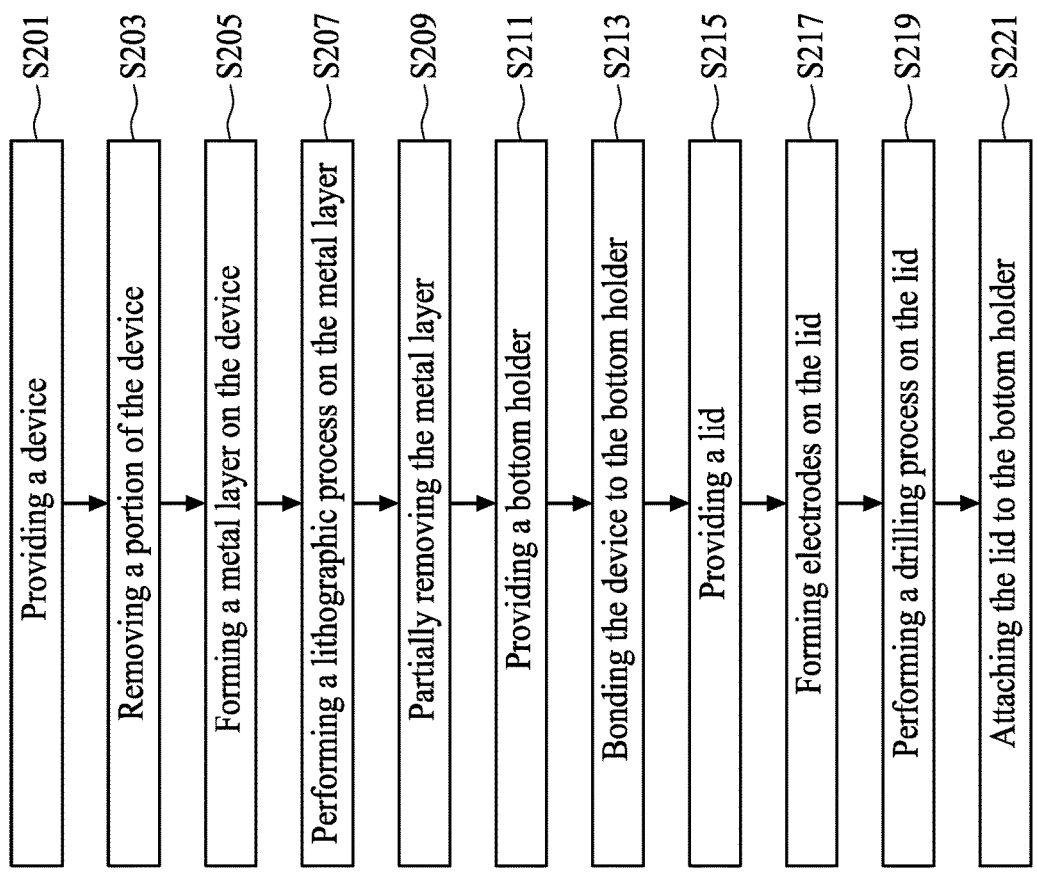
FIG. 15 is a flow diagram illustrating a method of manufacturing a package structure, in accordance with some embodiments of the present disclosure.

FIG. 15 is a flow diagram illustrating a method 200 of manufacturing a package structure, in accordance with some embodiments of the present disclosure. FIGS. 16A to 16K are schematic cross-sectional views illustrating sequential fabrication stages of the package structure P30 in FIG. 11, in accordance with some embodiments of the present disclosure.

In operation S201, a device 120A is provided as shown in FIG. 16A. In some embodiments, a lithographic process is performed on the device 120A to form a patterned photoresist 192 thereon.

In operation S203, a portion of the device 120A is removed as shown in FIG. 16B. In some embodiments, a dry or wet etching process is performed on the device 120A to remove a portion of the device 120A not protected by the patterned photoresist 192. After the patterned photoresist 192 is removed, the remaining device refers to a device 120 as described above or illustrated in any of FIGS. 1 to 14. In some embodiments, a protruding member 120P is formed above a top surface S1 of the device 120 after the operation S203.

In operation S205, a metal layer 194A is formed on the device 120 as shown in FIG. 16C. In some embodiments, the metal layer 194A is conformally formed on the device 120 and the protruding member 120P using a physical vapor deposition (PVD) process or an atomic layer deposition (ALD) process. In some embodiments, the metal layer 194A is made of conductive materials such as aluminum, copper, iron, silver or gold. In some embodiments, the thickness of the metal layer 194A is known and uniformly controlled.

In operation S207, a lithographic process is performed on the metal layer 194A as shown in FIG. 16D. After operation S207, a patterned photoresist 196 is formed on the metal layer 194A.

In operation S209, the metal layer 194A is partially removed as shown in FIG. 16E. In some embodiments, a dry or wet etching process is performed on the metal layer 194A to remove portions of the metal layer 194A not protected by the patterned photoresist 196. After the patterned photoresist 196 is removed, the remaining metal layer 194A forms a first electrode 180A on the device 120 and a third electrode 190A on the protruding member 120P over the device 120.

In operation S211, a bottom holder 108 is provided as shown in FIG. 16F. In some embodiments, the bottom holder 108 includes a base 102 and a sidewall 106 connected to the base 102. In some embodiments, the bottom holder 108 is made of epoxy resin or ceramics and includes a lead frame (not shown).

In operation S213, the device 120 is bonded to the bottom holder 108 as shown in FIG. 16G. In some embodiments, the device 120 with the first electrode 180A and the third electrode 190A is attached to the base 102 using a wire-bonding process. The device 120 disposed on the base 102 is surrounded by the sidewall 106. In some embodiments, a die attach film (DAF, not shown) is disposed between the device 120 and the base 102 to increase adhesion therebetween.

In operation S215, a lid 104A is provided as shown in FIG. 16H. In some embodiments, the lid 104A is made of the same material as the bottom holder 108. The lid 104A has an exterior surface S2 and an interior surface S3 opposite to the exterior surface S2. In some embodiments, a hole 110A is formed at the interior surface S3. The hole 110A may be formed by removing a portion of the lid 104A using a drilling process or an etching process. In some embodiments, the hole 110A has a frustoconical shape tapered toward the interior surface S3.

In operation S217, electrodes are formed on the lid 104A as shown in FIG. 16I. In some embodiments, a second electrode 180B and a fourth electrode 190B are formed on the exterior surface S2. The formation of the second and fourth electrode 180B, 190B at least includes performing a deposition process, a lithographic process and an etching process on the lid 104A. In some embodiments, a horizontal distance between the second and fourth electrode 180B, 190B on the lid 104A is substantially the same as a horizontal distance between the first and third electrode 180A, 190A on the device 120.

In operation S219, a drilling process is performed on the lid 104A as shown in FIG. 16J. In some embodiments, a portion of the lid 104 inside the hole 110A is further drilled to form an opening 110 such that the opening 110 penetrates the lid 104. The opening 110 connects the exterior surface S2 and the interior surface S3. In some embodiments, the opening 110 has a frustoconical shape tapered toward the interior surface S3.

In operation S221, the lid 104 is attached to the bottom holder 108 as shown in FIG. 16K. In some embodiments, the attachment of the lid 104 to the bottom holder 108 is in a manner that the exterior surface S2 is confronted with the device 120. At such time, the second electrode 180B is aligned with the first electrode 180A and the fourth electrode 190B is aligned with the third electrode 190A. In some embodiments, the third electrode 190A is supported by the protruding member 120P to ensure contact between the third electrode 190A and the fourth electrode 190B. In some embodiments, the opening 110 is formed before the lid 104 is disposed over the base 102 and the device 120. In other embodiments, the base 102, the lid 104 and the sidewall 106 may be formed at the same time and a molding member 100 including the base 102, the lid 104 and the sidewall 106 can be a single structure that encases the device 120. In such embodiments, the opening 110 may be formed after the device 120 is encased. In some embodiments, a sealant (not shown) is disposed between the lid 104 and the bottom holder 108 to increase adhesion therebetween. As a result, the package structure P30 in FIG. 11 is generally formed.

Figure 17:
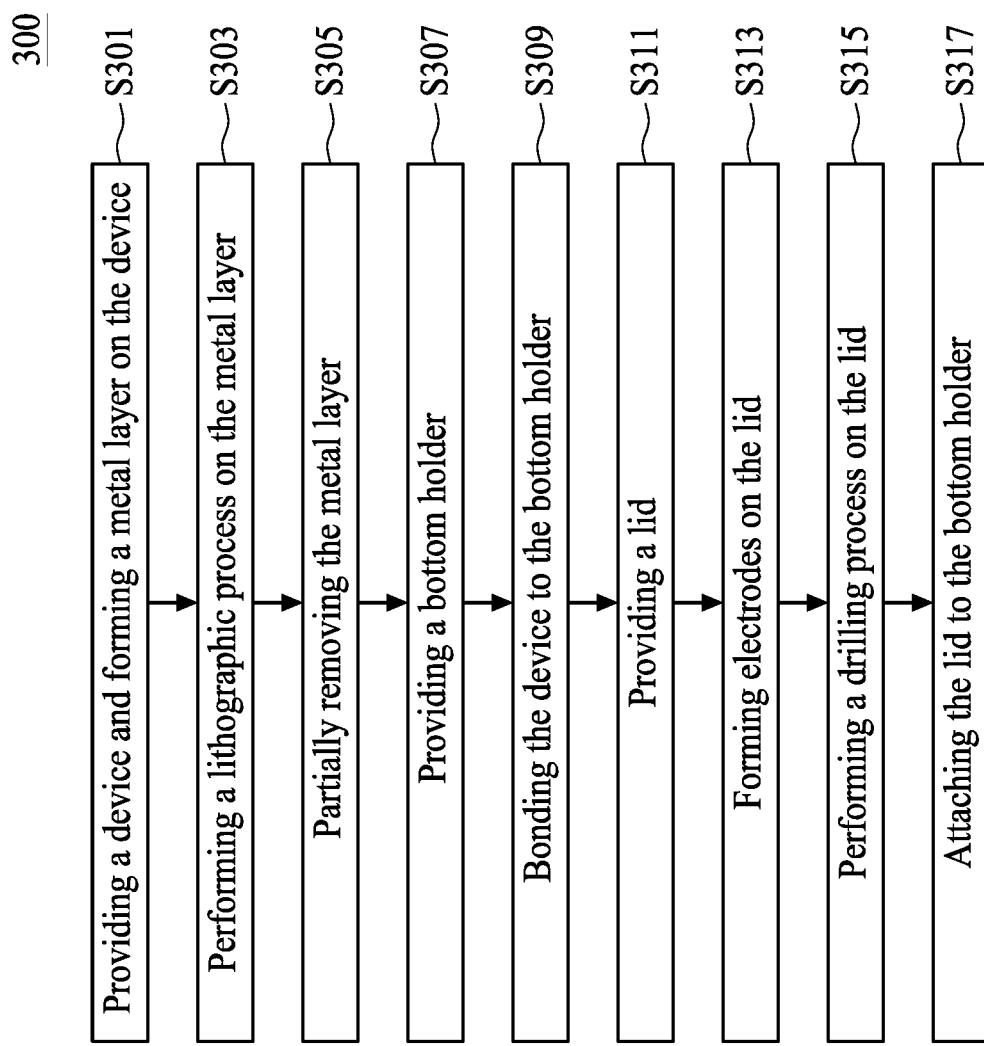
FIG. 17 is a flow diagram illustrating another method of manufacturing a package structure, in accordance with some embodiments of the present disclosure.

FIG. 17 is a flow diagram illustrating a method 300 of manufacturing a package structure, in accordance with some embodiments of the present disclosure. FIGS. 18A to 18I are schematic cross-sectional views illustrating sequential fabrication stages of the package structure P40 in FIG. 12, in accordance with some embodiments of the present disclosure.

In operation S301, a device 120 is provided and a metal layer 194B is formed on the device 120 as shown in FIG. 18A. In some embodiments, the metal layer 194B is formed using a PVD process or an ALD process. In some embodiments, the metal layer 194B is made of conductive materials such as aluminum, copper, iron, silver or gold. In some embodiments, the thickness of the metal layer 194B is known and uniformly controlled.

In operation S303, a lithographic process is performed on the metal layer 194B as shown in FIG. 18B. After operation S303, a patterned photoresist 198 is therefore formed on the metal layer 194B.

In operation S305, the metal layer 194B is partially removed as shown in FIG. 18C. In some embodiments, a dry or wet etching process is performed on the metal layer 194B to remove portions of the metal layer 194B not protected by the patterned photoresist 198. After the patterned photoresist 198 is removed, the remaining metal layer 194B forms a first electrode 180A and a third electrode 190A on the device 120.

In operation S307, a bottom holder 108 is provided as shown in FIG. 18D. In some embodiments, the bottom holder 108 includes a base 102 and a sidewall 106 connected to the base 102. In some embodiments, the bottom holder 108 is made of epoxy resin or ceramics and includes a lead frame (not shown).

In operation S309, the device 120 is bonded to the bottom holder 108 as shown in FIG. 18E. In some embodiments, the device 120 with the first electrode 180A and the third electrode 190A is attached to the base 102 using a wire-bonding process. The device 120 disposed on the base 102 is surrounded by the sidewall 106. In some embodiments, a die attach film (DAF, not shown) is disposed between the device 120 and the base 102 to increase adhesion therebetween.

Figure 18I:
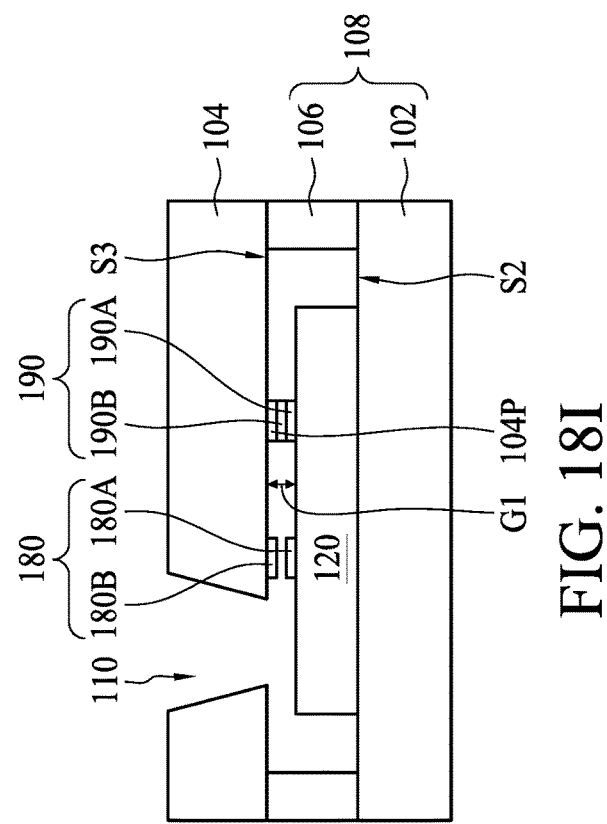
Figure 18F:
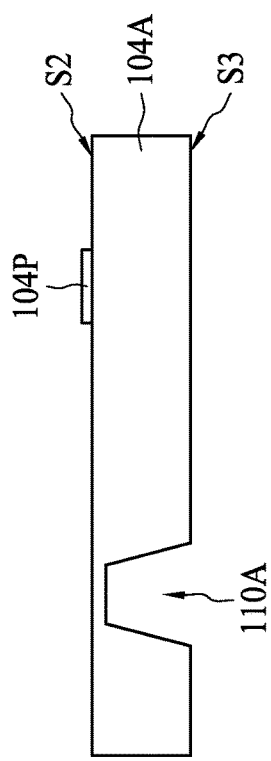

In operation S311, a lid 104A is provided as shown in FIG. 18F. In some embodiments, the lid 104A is made of the same material as the bottom holder 108. The lid 104A has an exterior surface S2 and an interior surface S3 opposite to the exterior surface S2. In some embodiments, a protruding member 104P is formed on the exterior surface S2. The formation of the protruding member 104P at least includes performing a deposition process, a lithographic process and an etching process on the lid 104A. In some embodiments, the protruding member 104P is formed using the same material as the bottom holder 108. In some embodiments, a hole 110A is formed at the interior surface S3. The hole 110A may be formed by removing a portion of the lid 104A using a drilling process or an etching process. In some embodiments, the hole 110A has a frustoconical shape tapered toward the interior surface S3.

Figure 18G:
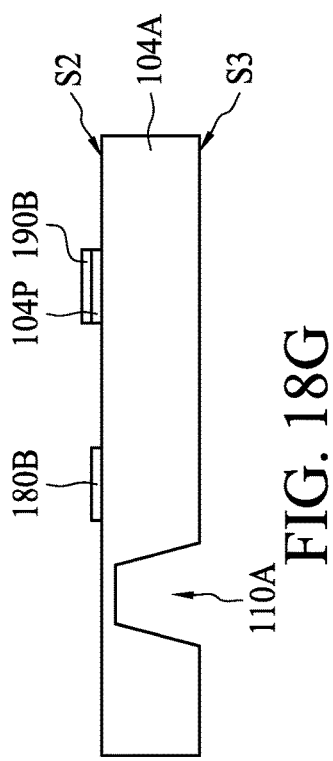

In operation S313, a second electrode 180B and a fourth electrode 190B are formed on the lid 104A as shown in FIG. 18G. In some embodiments, the second electrode 180B is formed on the exterior surface S2 of the lid 104A and the fourth electrode 190B is formed on the protruding member 104P. The formation of the second and fourth electrode 180B, 190B at least includes performing a deposition process, a lithographic process and an etching process on the lid 104A. In some embodiments, a horizontal distance between the second and fourth electrode 180B, 190B on the lid 104A is substantially the same as a horizontal distance between the first and third electrode 180A, 190A on the device 120.

Figure 18H:
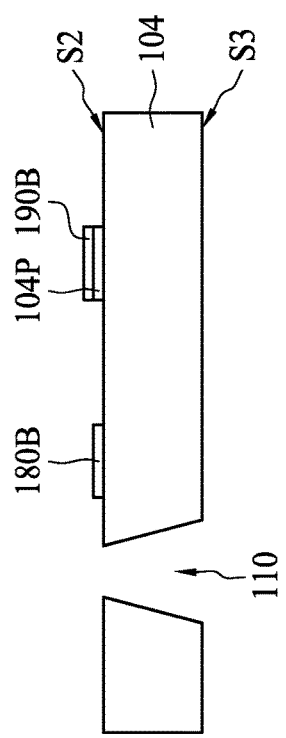

In operation S315, a drilling process is performed on the lid 104A as shown in FIG. 18H. In some embodiments, a portion of the lid 104 inside the hole 110A is further drilled to form an opening 110 such that the opening 110 penetrates the lid 104. The opening 110 connects the exterior surface S2 and the interior surface S3. In some embodiments, the opening 110 has a frustoconical shape tapered toward the interior surface S3.

In operation S317, the lid 104 is attached to the bottom holder 108 as shown in FIG. 18I. In some embodiments, the attachment of the lid 104 to the bottom holder 108 is in a manner that the exterior surface S2 is confronted with the device 120. At such time, the second electrode 180B is aligned with the first electrode 180A and the fourth electrode 190B is aligned with the third electrode 190A. In some embodiments, the fourth electrode 190B is supported by the protruding member 104P to ensure contact between the third electrode 190A and the fourth electrode 190B. In some embodiments, a sealant (not shown) is disposed between the lid 104 and the bottom holder 108 to increase adhesion therebetween. As a result, the package structure P40 in FIG. 12 is generally formed.

Figure 19:
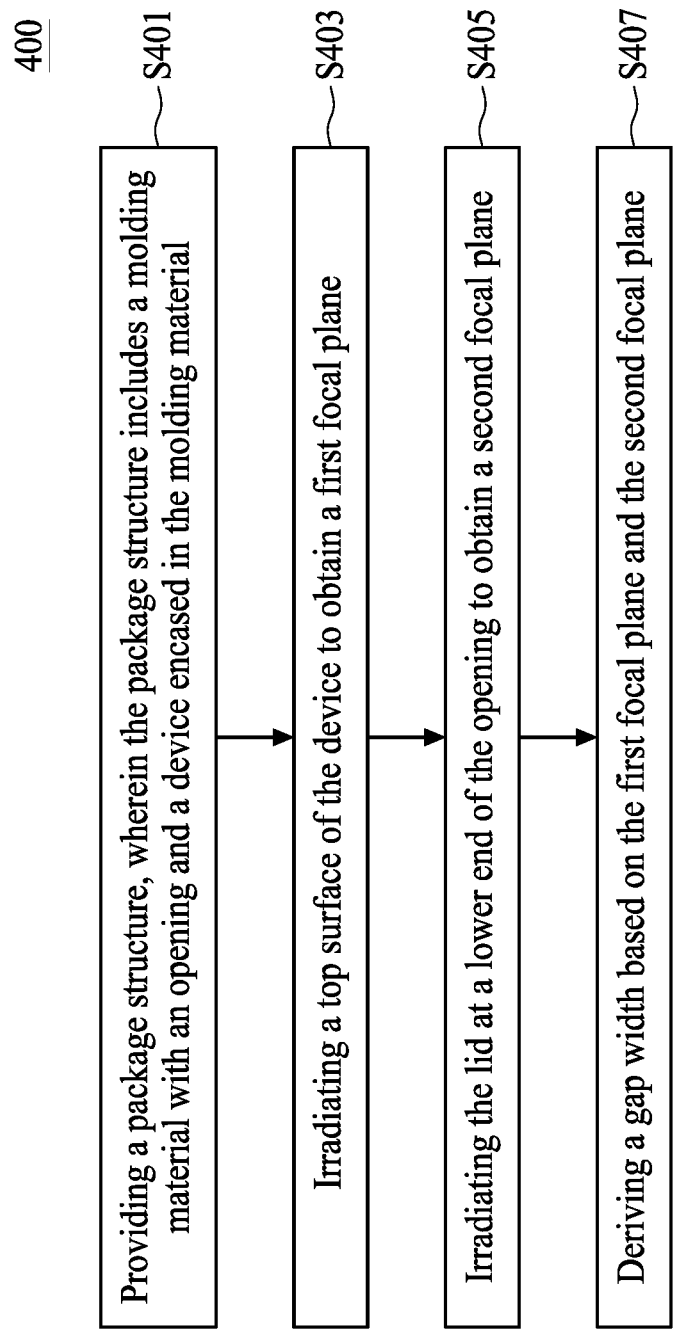
FIG. 19 is a flow diagram showing a method for measuring a gap width within a package structure, in accordance with some embodiments of the present disclosure.
Figure 20A:
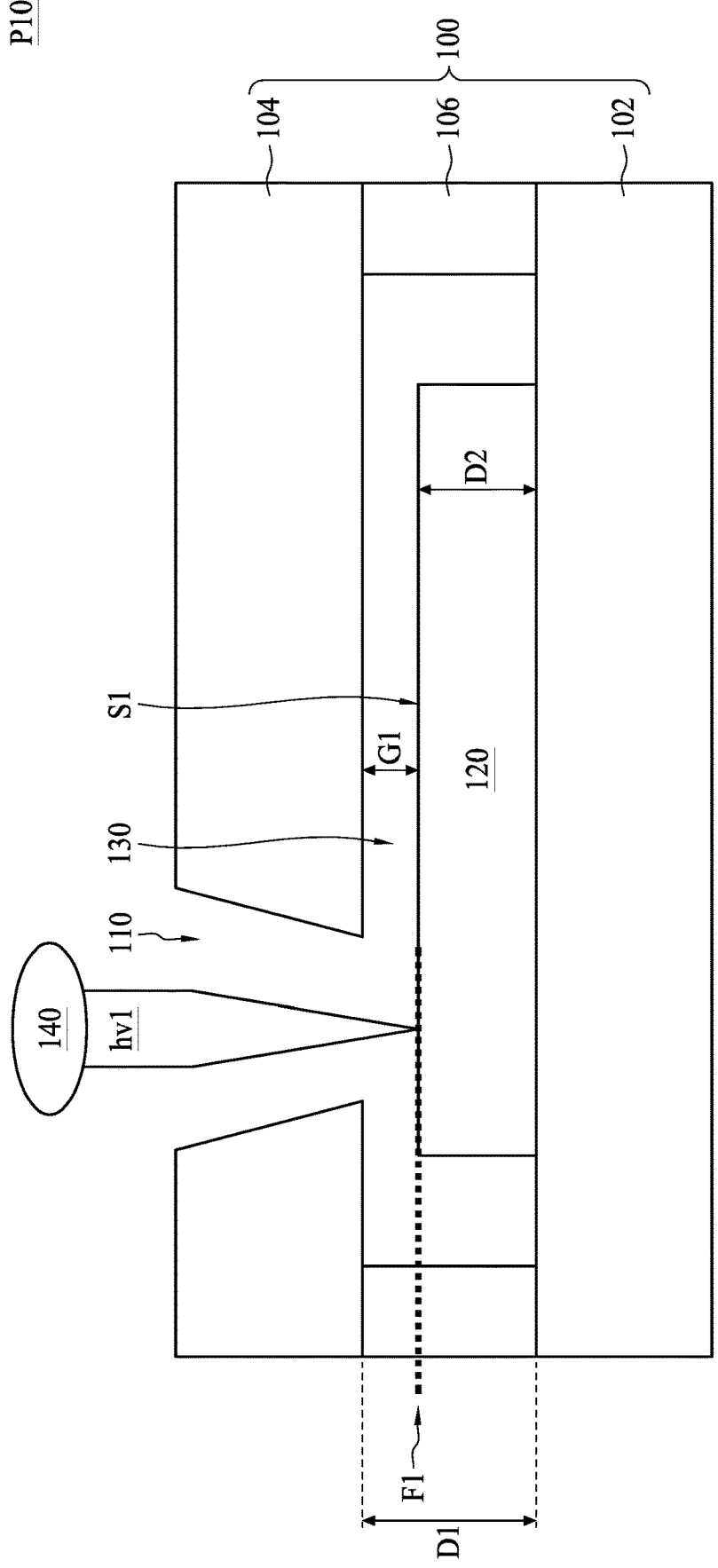
FIGS. 20A and 20B are schematic cross-sectional views showing sequential operations using the method in FIG. 19, in accordance with some embodiments of the present disclosure.
Figure 20B:
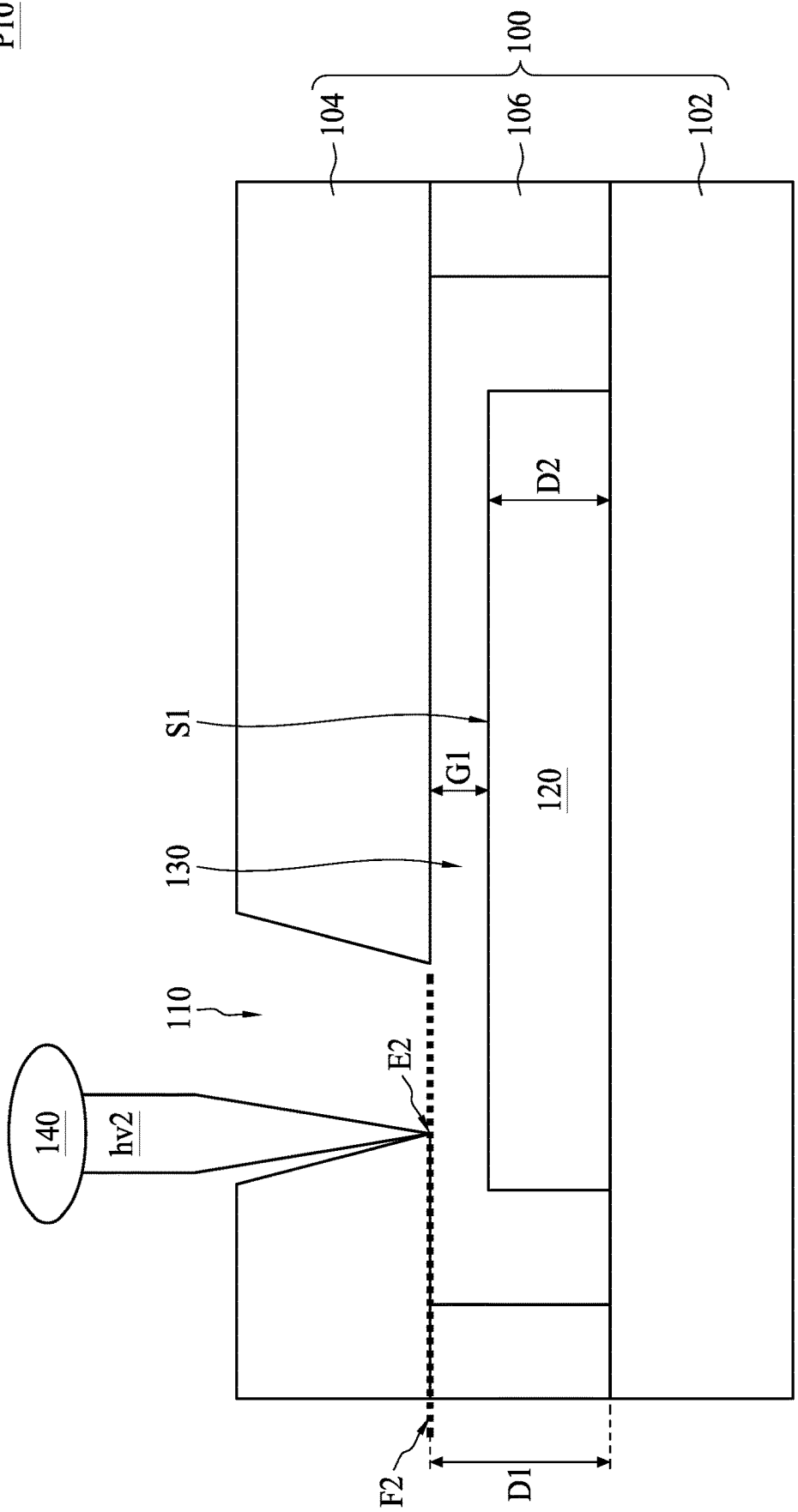

FIG. 19 is a flow diagram showing a method 400 for measuring a gap width within a package structure, in accordance with some embodiments of the present disclosure. In some embodiments, the method 400 is an optical measurement. In some embodiments, the method 400 can be performed on the package structure P10 in any one of FIGS. 1 to 3 after its formation. FIGS. 20A and 20B are schematic cross-sectional views showing sequential operations using the method 400 in FIG. 19, in accordance with some embodiments of the present disclosure.

In some embodiments, the method 400 begins with providing the package structure P10 according to operation S401 in FIG. 19.

Referring to FIG. 20A, in some embodiments, the top surface S1 of the device 120 is irradiated according to operation S403 in FIG. 19. In some embodiments, a light source 140 is used. In some embodiments, the light source 140 is configured to emit visible light such as white light. In some embodiments, the light source 140 is configured to emit invisible light such as X-ray, infrared (IR) or ultraviolet (UV). In some embodiments, the light source 140 may emit radiation to irradiate a portion of the package structure P10. In some embodiments, the irradiation can be adjusted by a motor (not shown) such that the radiation can be focused on a desired portion of the package structure P10 such as the top surface S1 of the device 120 or the lid 104 at the lower end E2 of the opening 110. In some embodiments, the opening 110 functions as an optical window for the radiation to pass through.

Still referring to FIG. 20A, the light source 140 emits a first radiation hv1, which passes through the opening 110 and is focused on the top surface S1 of the device 120. In some embodiments, the top surface S1 of the device 120 is irradiated by the first radiation hv1 to obtain a first focal plane F1 associated with the top surface S1 of the device 120. In some embodiments, the first focal plane F1 refers to the plane where an image of the top surface S1 of the device 120 is the clearest. The first focal plane F1 is substantially coplanar with the top surface S1 of the device 120.

Referring to FIG. 20B, in some embodiments, the lid 104 is irradiated at the lower end E2 of the opening 110 according to operation S405 in FIG. 19. In some embodiments, after emitting the first radiation hv1, the light source 140 emits a second radiation hv2, which passes through the opening 110 and is focused on the lid 104 at the lower end E2 of the opening 110. In some embodiments, the lid 104 at the lower end E2 of the opening 110 is irradiated by the second radiation hv2 to obtain a second focal plane F2 associated with the lid 104 at the lower end E2 of the opening 110. In some embodiments, the second focal plane F2 refers to the plane where an image of the lid 104 at the lower end E2 of the opening 110 is the clearest. The second focal plane F2 is substantially coplanar with the interior surface of the lid 104 facing the top surface S1 of the device 120, and the second focal plane F2 is substantially parallel to the first focal plane F1. In some embodiments, the opening 110 is tapered toward the device 120 such that the first radiation hv1 and the second radiation hv2 may not be blocked by a portion of the lid 104.

Referring to FIGS. 20A and 20B, in some embodiments, the gap width G1 is derived based on the first focal plane F1 and the second focal plane F2 according to operation S407 in FIG. 19. In some embodiments, a distance between the top surface S1 of the device 120 and an interior surface of the lid 104 facing the top surface S1 of the device 120 can be derived based on the first focal plane F1 and the second focal plane F2. By calculating a difference between levels of the first focal plane F1 and the second focal plane F2, a distance that is substantially equal to the gap width G1 within the package structure P10 can therefore be obtained.

In some embodiments, the gap width G1 derived from the method 400 is more precise than purely subtracting a thickness D2 of the device 120 from a height D1 of the sidewall 106. Since different molding members 100 and different devices 120 inevitably have tolerances among their heights or thicknesses although they have the same product or device specification. Therefore, when deriving the gap width G1 according to dimensions of the molding member 100 and the device 120, tolerances accompanying the height of the molding member 100 and the thickness of the device 120 will also be taken in account, which results in more imprecision.

In some embodiments, the method 400 that employs the optical measurement does not consider tolerances related to the dimensions of the molding member 100 and the device 120; instead, the method 400 calculates a difference between two levels of focal planes. Therefore, the gap width G1 can be obtained with greater precision. On the other hand, for package structures in which the gap requires precise size control, the method 400 is beneficial to improve the performance and the reliability of the device inside in package structure.

Figure 20C:
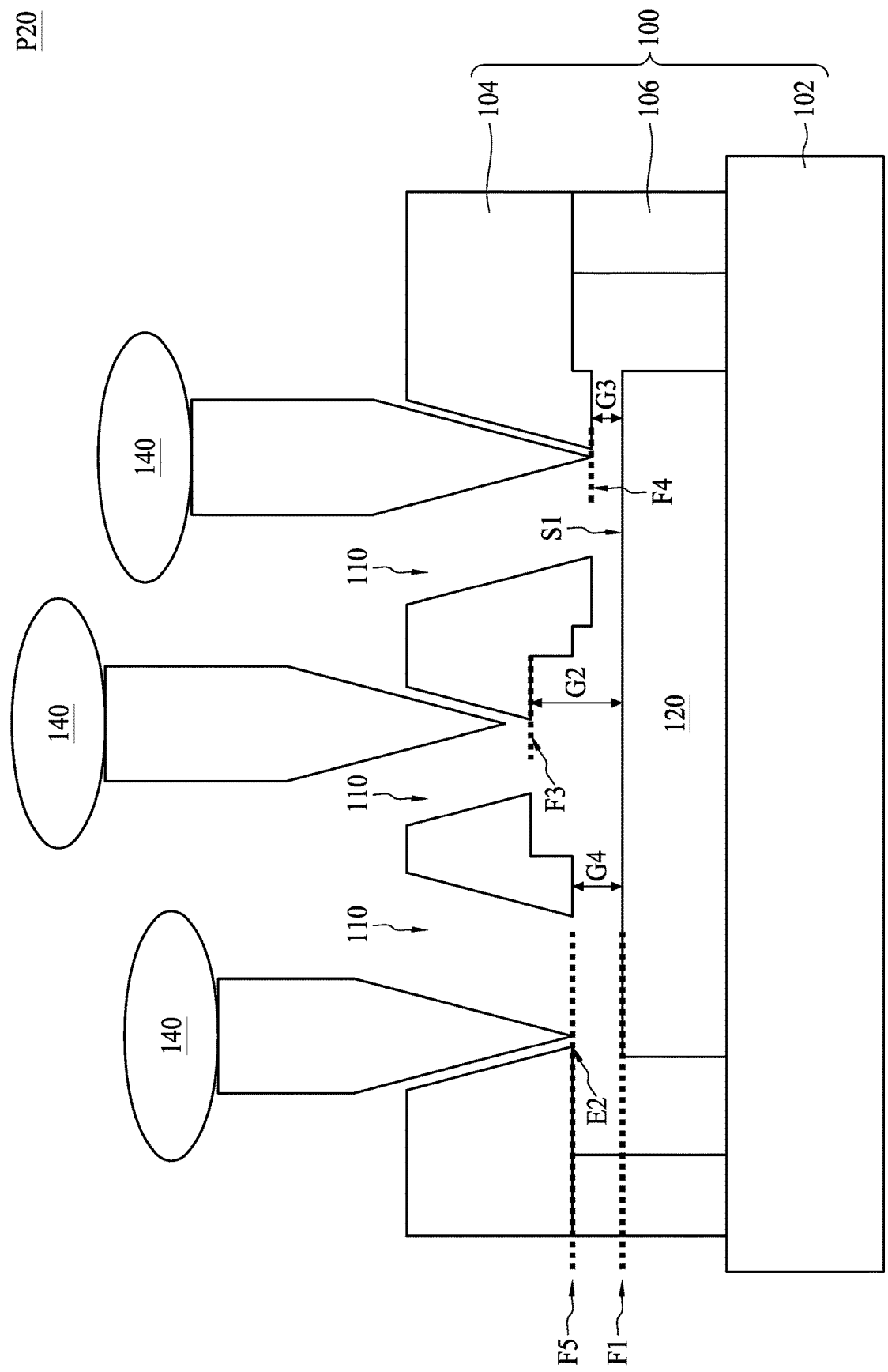
FIG. 20C is a schematic cross-sectional view showing the method in FIG. 19 applied to the package structure P20 in FIG. 9, in accordance with some embodiments of the present disclosure.

In some embodiments, the method 400 can also be performed to obtain multiple gap widths G2, G3 and G4 of the package structure P20 in FIG. 9. FIG. 20C is a schematic cross-sectional view showing the method 400 applied to the package structure P20, in accordance with some embodiments of the present disclosure. According to operation S401 in FIG. 19, the package structure P20 described in FIG. 9 is provided. According to operation S403 in FIG. 19, the top surface S1 of the device 120 inside the package structure P20 is irradiated to obtain the first focal plane F1. According to operation S405 in FIG. 19, each lower end E2 of each opening 110 proximal to the device 120 is respectively irradiated to obtain a second focal plane F3, F4 and F5. According to operation S407 in FIG. 19, gap widths G2, G3 and G4 can be respectively derived by calculating a difference between levels of the first focal plane F1 and the second focal plane F3, a difference between levels of the first focal plane F1 and the second focal plane F4 and a difference between levels of the first focal plane F1 and the second focal plane F5.

Figure 21:
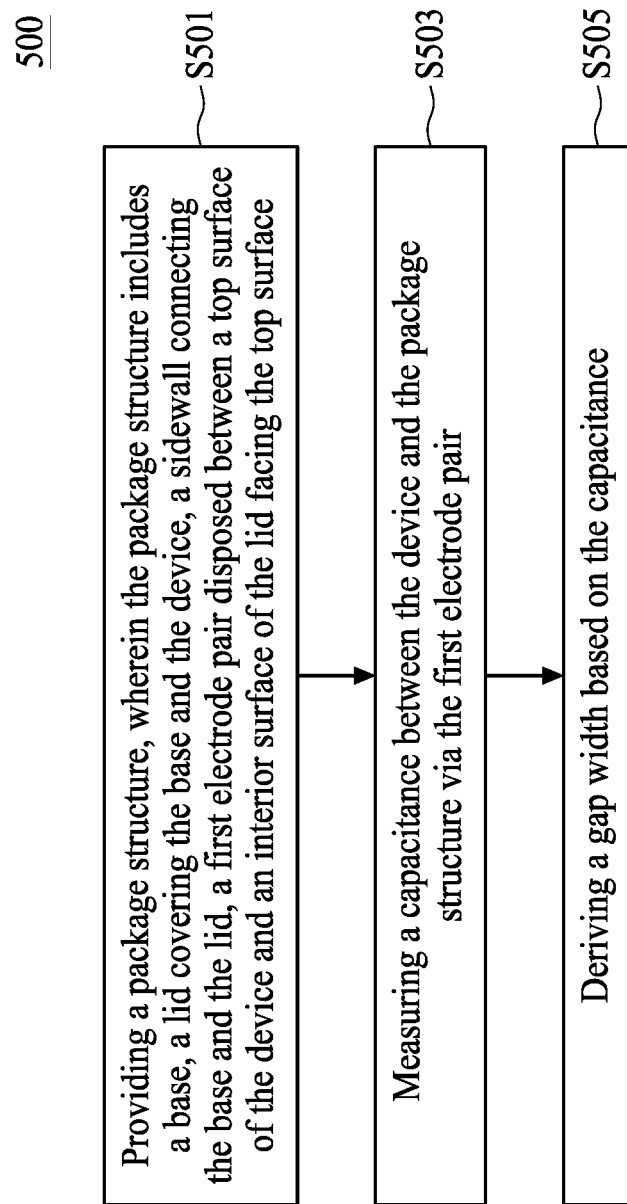
FIG. 21 is a flow diagram showing another method for measuring a gap width within a package structure, in accordance with some embodiments of the present disclosure.

FIG. 21 is a flow diagram showing a method 500 for measuring a gap width within a package structure, in accordance with some embodiments of the present disclosure. In some embodiments, the method 500 is an electrical measurement. In some embodiments, the method 500 can be performed on the package structure P30 in FIG. 11 formed using the method 200 in FIG. 15 or the package structure P40 in FIG. 12 formed using the method 300 in FIG. 17.

In some embodiments, the method 500 begins with providing the package structure P30 in FIG. 11 or the package structure P40 in FIG. 12 according to operation S501 in FIG. 21. In some embodiments, thicknesses of the two electrode pairs 180 and 190 are already known.

According to operation S503 in FIG. 21, a capacitance between the device 120 and the package structure P30 or P40 is measured via the first electrode pair 180. In some embodiments, the capacitance measurement is carried out between the first electrode 180A and the second electrode 180B.

According to operation S505 in FIG. 21, the gap width G1 is derived based on the capacitance measurement. In some embodiments, the obtained capacitance can be used to derive a distance d (not shown) between the top surface S1 of the device 120 and the interior surface of the lid 104. In some embodiments, the derivation of the distance d includes deriving a separation between the first electrode 180A and the second electrode 180B. In some embodiments, the derivation is according to an equation for the capacitance of a parallel plate capacitor:

$$C = \varepsilon_0 \times A/d, \text{ wherein}$$

C is the capacitance, in farads (F);
$\varepsilon_0$ is the electric constant, i.e., $8.854 \times 10^{-12}$ F/m; and
A is the area of each of the first electrode pair 180, in square meters (m$^2$).

As a result, the gap width G1 can be derived by summing the thickness of the first electrode pair 180 and the distance d. In some embodiments, the gap width G1 obtained based on the capacitance measurement can be compared with the gap width G1 obtained based on the optical measurement to verify the precision of the capacitance measurement. In some embodiments, these results can be correlated with each other.

In some embodiments, the second electrode pair 190 can be used for measuring a resistance between the device 120 and the package structure P30 or P40 for precision considerations. In some embodiments, the resistance measurement is carried out between the third electrode 190A and the fourth electrode 190B. In some embodiments, when contact between the third electrode 190A and the fourth electrode 190B is established, the resistance will be a limited value (i.e. not extremely high), which shows the circuit is not open. In some embodiments, the obtained resistance indicates whether the molding member 100 and the device 120 are properly located. The alignment of the first electrode 180A and the second electrode 180B is critical to the capacitance measurement. In some embodiments, the obtained resistance can indicate whether the third electrode 190A and the fourth electrode 190B are properly aligned, which further indicates whether the first electrode 180A and the second electrode 180B are properly aligned. In some embodiments, the electrical measurement may employ one electrode pair or two electrode pairs to accomplish the gap width derivation.

In some embodiments, the gap width obtained by the electrical measurement can be correlated with the gap width obtained by the optical measurement. In some embodiments, after the correlation between the optical measurement and the electrical measurement is made and their results match each other, only electrode pairs for capacitance and/or resistance measurements inside the molding member are required and the optical measurement can be omitted. In some embodiments, package structures such as P50 in FIG. 13 and P60 in FIG. 14 not including any opening can also be used to obtain the gap width, providing the process for fabricating package structures is stable enough.

The present disclosure is directed to measurement methods that enable use of an optical measurement and/or an electrical measurement to obtain a precise gap width within a package structure.

For optical measurement, the package structure includes at least one opening in a lid of a molding member that encases a device. A portion of the device can be exposed by the opening. A light source is used to emit a first radiation that passes through the opening to irradiate the device and obtain a first focal plane. In some embodiments, the light source emits a second radiation that passes through the opening to irradiate the lid at a lower end of the opening and obtain a second focal plane. The gap width can be derived based on a difference between a level of the first focal plane and a level of the second focal plane. The opening is tapered toward the device such that the radiation may avoid being blocked by a portion of the lid. In some embodiments, after the optical measurement, the opening can be filled with a sealing member to prevent the device in the package structure from being contaminated by particles or moisture. A capping member can be disposed on the opening filled with the sealing member to provide further protection to the device.

For electrical measurement, the package structure includes at least a pair of electrodes. One of the electrodes is attached to the device and the other electrode is attached to an interior surface of the lid facing the device. The pair of electrodes can be used to measure a capacitance between the molding member and the device. The obtained capacitance can be used to derive a separation between the pair of electrodes according to an equation for a capacitance of a parallel plate capacitor. Since a thickness of the electrodes is known, the gap width can be derived by summation of the thicknesses of the pair of electrodes and the separation. In some embodiments, an additional pair of electrodes can be used for resistance measurement. Similar to the electrodes for capacitance measurement, one of the electrodes is attached to the device and the other electrode is attached to the interior surface of the lid. However, because resistance measurement requires the two electrodes to be in contact with each other, a protruding member is disposed on the device or on the interior surface of the lid to support one of the electrodes to ensure proper contact between the two electrodes. The resistance measurement can ensure whether the molding member and the device are properly located or whether the pair of electrodes for capacitance measurement are properly aligned such that the separation can be derived precisely.

According to the optical measurement and the electrical measurement provided by the present disclosure, tolerances related to dimensions of the molding member and the device do not have to be considered. Therefore, the gap width inside the package structure can be measured with much greater precision. Moreover, gap widths respectively obtained by the optical measurement and by the electrical measurement can be correlated with each other. Therefore, a package structure including only electrode pairs inside the molding member can be used for measurement of capacitance and/or resistance without requiring an opening for optical measurement.

One aspect of the present disclosure provides a measurement method. The measurement method includes providing a base, a device disposed on the base, and a lid disposed over the base and the device, wherein the lid includes an opening disposed above and tapered toward the device, and the opening includes a lower end proximal to the device; irradiating a top surface of the device through the opening to obtain a first focal plane associated with the top surface of the device; irradiating the lid at the lower end of the opening to obtain a second focal plane associated with the lid at the lower end of the opening; and deriving a distance between the top surface of the device and an interior surface of the lid facing the top surface of the device based on a difference between a level of the first focal plane and a level of the second focal plane.

In some embodiments, the top surface of the device and the lid at the lower end of the opening are irradiated by X-ray, infrared (IR), ultraviolet (UV) or visible light.

In some embodiments, the irradiation includes adjusting a focus on the top surface of the device or the lid at the lower end of the opening.

In some embodiments, the first focal plane is substantially coplanar with the top surface of the device, and the second focal plane is substantially coplanar with the interior surface of the lid facing the top surface of the device.

In some embodiments, the first focal plane is substantially parallel to the second focal plane.

In some embodiments, the measurement method further includes sealing the opening after the deriving of the distance.

In some embodiments, the opening is formed by removing a portion of the lid.

In some embodiments, the opening is formed before the lid is disposed over the base and the device.

Another aspect of the present disclosure provides another measurement method. The measurement method includes encasing a device in a package structure comprising a base, a lid covering the base and the device, a sidewall connecting the base and the lid, a first electrode pair disposed between a top surface of the device and an interior surface of the lid facing the top surface; measuring a capacitance between the device and the package structure via the first electrode pair; and deriving a distance between the top surface and the interior surface based on the measurement of the capacitance.

In some embodiments, the first electrode pair comprise a first electrode disposed on the top surface of the device and a second electrode disposed on the interior surface of the lid, and the first electrode is aligned with the second electrode.

In some embodiments, the deriving of the distance includes deriving a separation between the first electrode and the second electrode.

In some embodiments, the measurement method further includes measuring a resistance between the device and the package structure via the second electrode pair disposed between the top surface and the interior surface and comprising a third electrode disposed on the top surface of the device and a fourth electrode disposed on the interior surface of the lid.

In some embodiments, the third electrode is aligned with the fourth electrode.

In some embodiments, the measurement method further includes forming a protruding member on the top surface of the device, and disposing the third electrode on the protruding member.

In some embodiments, the measurement method further includes forming a protruding member on the interior surface of the lid, and disposing the fourth electrode on the protruding member.

Another aspect of the present disclosure provides a package structure. The package structure includes a base, a device disposed on the base, a lid disposed over the base and the device, wherein the lid includes an opening disposed above and tapered toward the device.

In some embodiments, a distance between a top surface of the device and an interior surface of the lid facing the top surface of the device is between about 5 um and about 500 um.

In some embodiments, the opening has a first width and a second width above the first width and substantially greater than the first width.

In some embodiments, a difference between the first width and the second width is between about 5 um and about 100 um.

In some embodiments, the package structure further includes a sealing member filling or covering the opening.

The foregoing outlines features of several embodiments such that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods and steps.

The invention claimed is:

1. A measurement method, comprising:
providing a base, a device disposed on the base, and a lid disposed over the base and the device, wherein the lid includes an opening disposed above and tapered toward the device, and the opening includes a lower end proximal to the device;

irradiating a top surface of the device through the opening to obtain a first focal plane associated with the top surface of the device;

irradiating the lid at the lower end of the opening to obtain a second focal plane associated with the lid at the lower end of the opening; and deriving a distance between the top surface of the device and an interior surface of the lid facing the top surface of the device based on a difference between a level of the first focal plane and a level of the second focal plane.

2. The measurement method according to claim 1, wherein the top surface of the device and the lid at the lower end of the opening are irradiated by X-ray, infrared (IR), ultraviolet (UV) or visible light.

3. The measurement method according to claim 1, wherein the irradiation includes adjusting a focus on the top surface of the device or the lid at the lower end of the opening.

4. The measurement method according to claim 1, wherein the first focal plane is substantially coplanar with the top surface of the device, and the second focal plane is substantially coplanar with the interior surface of the lid facing the top surface of the device.

5. The measurement method according to claim 1, wherein the first focal plane is substantially parallel to the second focal plane.

6. The measurement method according to claim 1, further comprising sealing the opening after the deriving of the distance.

7. The measurement method according to claim 1, wherein the opening is formed by removing a portion of the lid.

8. The measurement method according to claim 1, wherein the opening is formed before the lid is disposed over the base and the device.

9. A measurement method, comprising:
providing a device having a top surface;
forming an opening extending through a lid;
disposing the lid above the device to at least partially expose the top surface of the device through the opening;
irradiating the top surface of the device through the opening to obtain a first focal plane associated with the top surface of the device;
irradiating a lower end of the opening proximal to the top surface of the device to obtain a second focal plane associated with the lower end of the opening; and
deriving a vertical distance between the first focal plane and the second focal plane.

10. The measurement method according to claim 9, wherein the irradiating the top surface of the device and the irradiating the lower end of the opening are implemented sequentially.

11. The measurement method according to claim 9, wherein the vertical distance is substantially equal to a gap width between the top surface of the device and an interior surface of the lid facing to the top surface of the device.

12. The measurement method according to claim 9, wherein the opening has inconsistent width along a thickness of the lid.

13. The measurement method according to claim 9, further comprising laterally moving a light source after the irradiating the top surface of the device.

14. The measurement method according to claim 9, wherein the opening is tapered toward or away from the top surface of the device.

15. The measurement method according to claim 9, further comprising forming a sealing member over the device and filled the entire opening after the deriving the vertical distance.

16. The measurement method according to claim 15, wherein the sealing member is irremovable from the opening.

17. A measurement method, comprising:
providing a device having a top surface;
forming a first opening and a second opening extending through a lid;
disposing the lid above the device to at least partially expose the top surface of the device through the first opening and the second opening;
irradiating the top surface of the device through the first opening or the second opening to obtain a first focal plane associated with the top surface of the device;
irradiating a first lower end of the first opening proximal to the top surface of the device to obtain a second focal plane associated with the first lower end of the first opening;
irradiating a second lower end of the second opening proximal to the top surface of the device to obtain a third focal plane associated with the second lower end of the second opening; and
deriving a first vertical distance between the first focal plane and the second focal plane, and a second vertical distance between the first focal plane and the third focal plane.

18. The measurement method according to claim 17, wherein the first vertical distance is different from the second vertical distance, and a depth of the first opening is different from a depth of the second opening.

19. The measurement method according to claim 17, wherein the irradiating the first lower end of the first opening and the irradiating the second lower end of the second opening are implemented sequentially or simultaneously.

20. The measurement method according to claim 17, further comprising sealing the first opening and the second opening after the deriving the first vertical distance and the second vertical distance.

* * * * *